*(12)* United States Patent
Tsai et al.

(10) Patent No.: US 11,069,784 B2
(45) Date of Patent: Jul. 20, 2021

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Kuo-Chiang Tsai, Hsinchu (TW); Jyh-Huei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/415,909

(22) Filed: May 17, 2019

(65) Prior Publication Data

US 2020/0365698 A1 Nov. 19, 2020

(51) Int. Cl.

| | |
|---|---|
| *H01L 21/8234* | (2006.01) |
| *H01L 21/84* | (2006.01) |
| *H01L 21/8238* | (2006.01) |
| *H01L 27/088* | (2006.01) |
| *H01L 29/417* | (2006.01) |
| *H01L 29/78* | (2006.01) |
| *H01L 29/66* | (2006.01) |

(Continued)

(52) U.S. Cl.
CPC .. *H01L 29/41791* (2013.01); *H01L 21/32139* (2013.01); *H01L 21/823431* (2013.01); *H01L 21/823821* (2013.01); *H01L 21/845* (2013.01); *H01L 27/0886* (2013.01); *H01L 29/401* (2013.01); *H01L 29/66795* (2013.01); *H01L 29/7851* (2013.01)

(58) Field of Classification Search
CPC ............. H01L 27/0886; H01L 27/0924; H01L 27/10826; H01L 27/10879; H01L 27/1211; H01L 21/823431; H01L 21/823821; H01L 21/845; H01L 29/41791; H01L 29/66772; H01L 29/66795; H01L 29/7831; H01L 29/785; H01L 29/7858; H01L 29/786; H01L 2924/13067
See application file for complete search history.

(56) References Cited

U.S. PATENT DOCUMENTS 6,180,430 B1 * 1/2001 Kong ................ G02F 1/133512
                                                        438/29
8,896,068 B2 * 11/2014 Mayuzumi ........ H01L 21/76877
                                                        257/369
9,105,490 B2    8/2015 Wang et al.
(Continued)

*Primary Examiner* — Maliheh Malek
(74) *Attorney, Agent, or Firm* — Slater Matsil, LLP

(57) ABSTRACT

FinFET devices with source/drain contacts with reduced resistance/capacitance power loss and with an enhanced processing window between the source/drain contacts and a gate via and methods of manufacture are described herein. A metal riser may be formed in a first recess of a source/drain contact of a first material. The metal riser and a contact via may be formed from a second material and the contact via may be formed over the metal riser to provide a hybrid source/drain contact of a finFET with a wide surface contact area at an interface between the source/drain contact and the metal riser. A dielectric fill material and/or a conformal contact etch stop layer may be used to form an isolation region in a second recess of the source/drain contact to extend a processing window disposed between the isolation region and a gate contact of the finFET.

20 Claims, 17 Drawing Sheets

(51) Int. Cl.
*H01L 29/40* (2006.01)
*H01L 21/3213* (2006.01)

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,211,092 B1* | 2/2019 | Cheng | H01L 29/66795 |
| 10,297,749 B1* | 5/2019 | Hashemi | H01L 45/1616 |
| 10,354,980 B1* | 7/2019 | Mushiga | H01L 27/11575 |
| 10,354,987 B1* | 7/2019 | Mushiga | H01L 21/76898 |
| 10,446,555 B2* | 10/2019 | Wang | H01L 23/528 |
| 10,483,396 B1* | 11/2019 | Chin | H01L 29/66803 |
| 10,522,649 B2* | 12/2019 | Cheng | H01L 29/4991 |
| 10,629,496 B2 | 4/2020 | More | H01L 21/02192 |
| 10,707,413 B1* | 7/2020 | Dutta | G11C 11/161 |
| 10,734,447 B2* | 8/2020 | Ando | H01L 27/2436 |
| 10,825,721 B2* | 11/2020 | Tsai | H01L 21/76831 |
| 10,833,190 B2* | 11/2020 | Bergendahl | H01L 29/0847 |
| 2003/0013253 A1* | 1/2003 | Hurley | H01L 27/115 438/257 |
| 2009/0236583 A1* | 9/2009 | Kuo | H01L 45/144 257/4 |
| 2013/0092985 A1* | 4/2013 | Ko | H01L 21/76834 257/288 |
| 2016/0155739 A1* | 6/2016 | Ting | H01L 21/823481 257/401 |
| 2016/0190133 A1* | 6/2016 | Wu | H01L 27/092 257/369 |
| 2017/0040318 A1* | 2/2017 | Hung | H01L 29/0649 |
| 2017/0054004 A1* | 2/2017 | Cheng | H01L 21/02178 |
| 2017/0222008 A1* | 8/2017 | Hsu | H01L 21/76877 |
| 2017/0352559 A1* | 12/2017 | Liu | H01L 21/67063 |
| 2017/0358497 A1* | 12/2017 | Cheng | H01L 21/823481 |
| 2018/0033866 A1* | 2/2018 | Liao | H01L 21/32137 |
| 2018/0040733 A1* | 2/2018 | Chang | H01L 29/785 |
| 2018/0151378 A1* | 5/2018 | Huang | H01L 29/7851 |
| 2018/0151429 A1* | 5/2018 | Wang | H01L 21/76849 |
| 2018/0174904 A1* | 6/2018 | Hsieh | H01L 29/66795 |
| 2018/0182856 A1* | 6/2018 | Lee | H01L 23/5226 |
| 2018/0294184 A1* | 10/2018 | Koh | H01L 29/66545 |
| 2018/0301371 A1* | 10/2018 | Wang | H01L 21/76846 |
| 2018/0315652 A1* | 11/2018 | Tsai | H01L 29/6656 |
| 2018/0337188 A1* | 11/2018 | Yu | H01L 21/30604 |
| 2018/0342615 A1* | 11/2018 | Bergendahl | H01L 29/785 |
| 2019/0123048 A1* | 4/2019 | Chang | H01L 27/0886 |
| 2019/0148514 A1* | 5/2019 | Lin | H01L 21/823864 257/401 |
| 2019/0157405 A1* | 5/2019 | Huang | H01L 21/3115 |
| 2019/0280099 A1* | 9/2019 | Zhang | H01L 29/785 |
| 2020/0006131 A1* | 1/2020 | Shimabukuro | H01L 21/76849 |
| 2020/0006139 A1* | 1/2020 | Tseng | H01L 21/76877 |
| 2020/0006336 A1* | 1/2020 | Lung | H01L 21/28518 |
| 2020/0035605 A1* | 1/2020 | Tsai | H01L 23/5283 |
| 2020/0043787 A1* | 2/2020 | Su | H01L 21/823475 |
| 2020/0043799 A1* | 2/2020 | Lee | H01L 21/0217 |
| 2020/0043858 A1* | 2/2020 | Wu | H01L 21/32135 |
| 2020/0044072 A1* | 2/2020 | Chiang | H01L 29/66795 |
| 2020/0058785 A1* | 2/2020 | Tsai | H01L 21/486 |
| 2020/0105613 A1* | 4/2020 | Hung | H01L 29/6659 |
| 2020/0105931 A1* | 4/2020 | Wu | H01L 29/785 |
| 2020/0126843 A1* | 4/2020 | Tsai | H01L 21/76802 |
| 2020/0126857 A1* | 4/2020 | Tsai | H01L 21/3086 |
| 2020/0135641 A1* | 4/2020 | Lee | H01L 21/76825 |
| 2020/0135871 A1* | 4/2020 | Tsai | H01L 21/76831 |
| 2020/0135912 A1* | 4/2020 | Tsai | H01L 21/823431 |
| 2020/0161297 A1* | 5/2020 | Chen | H01L 29/66795 |
| 2020/0176260 A1* | 6/2020 | Hung | H01L 29/66795 |
| 2020/0203531 A1* | 6/2020 | Tsai | H01L 29/66795 |
| 2020/0303245 A1* | 9/2020 | Tsai | H01L 21/7684 |
| 2020/0335588 A1* | 10/2020 | Huang | H01L 21/28568 |
| 2020/0343088 A1* | 10/2020 | Hsiao | H01L 21/7684 |
| 2020/0343135 A1* | 10/2020 | Huang | H01L 21/76826 |
| 2020/0350314 A1* | 11/2020 | Wang | H01L 29/45 |
| 2020/0350414 A1* | 11/2020 | Lee | H01L 21/3215 |
| 2020/0350416 A1* | 11/2020 | Hsu | H01L 23/485 |
| 2020/0357739 A1* | 11/2020 | Liaw | H01L 21/76829 |
| 2021/0020757 A1* | 1/2021 | Yang | H01L 27/0886 |
| 2021/0020761 A1* | 1/2021 | Tsai | H01L 29/6659 |

* cited by examiner

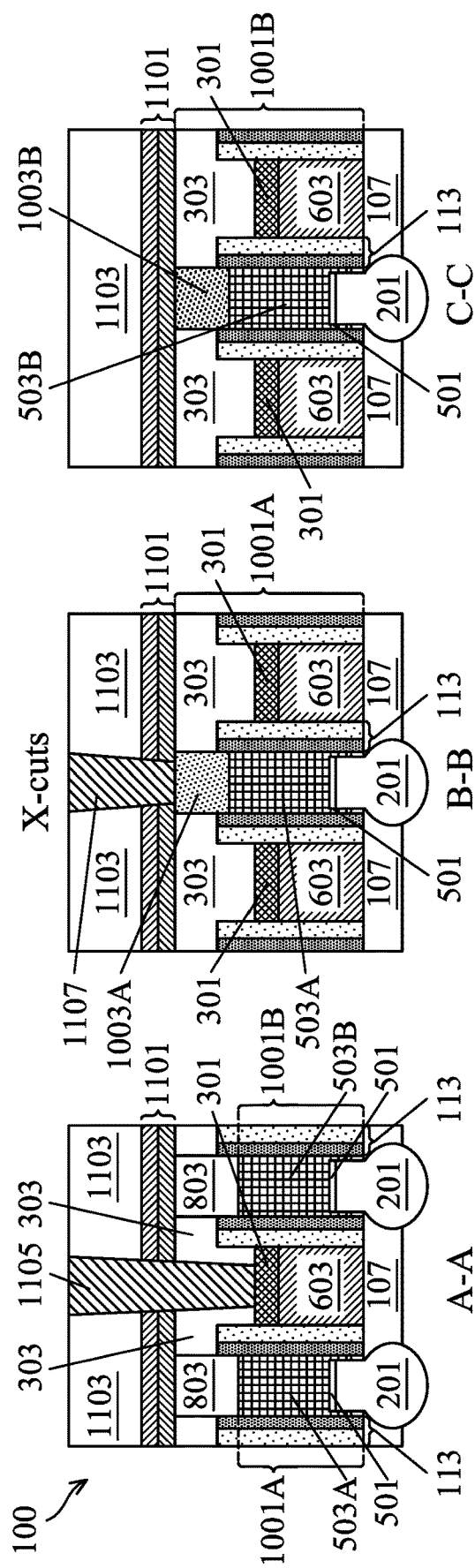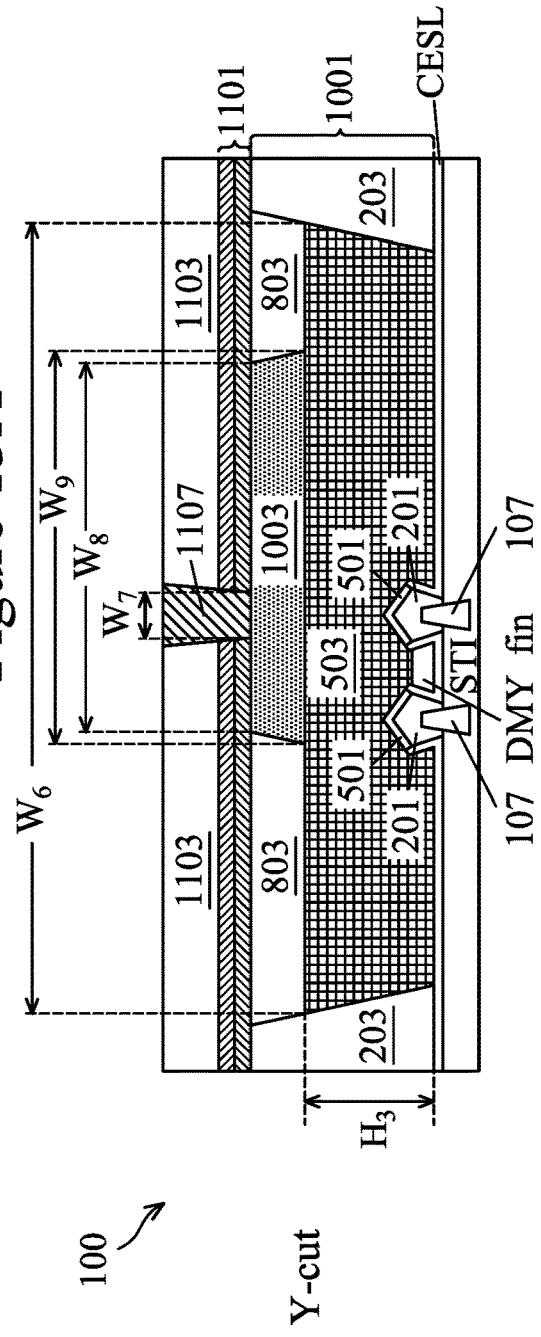
Figure 13A
Figure 13B

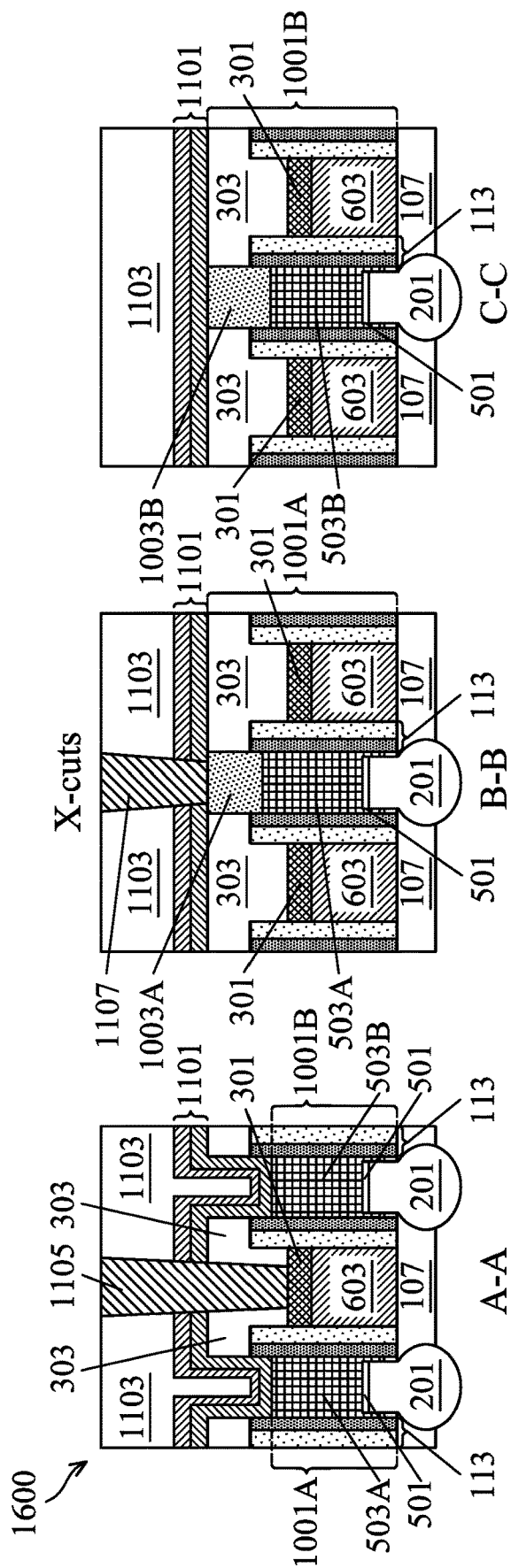
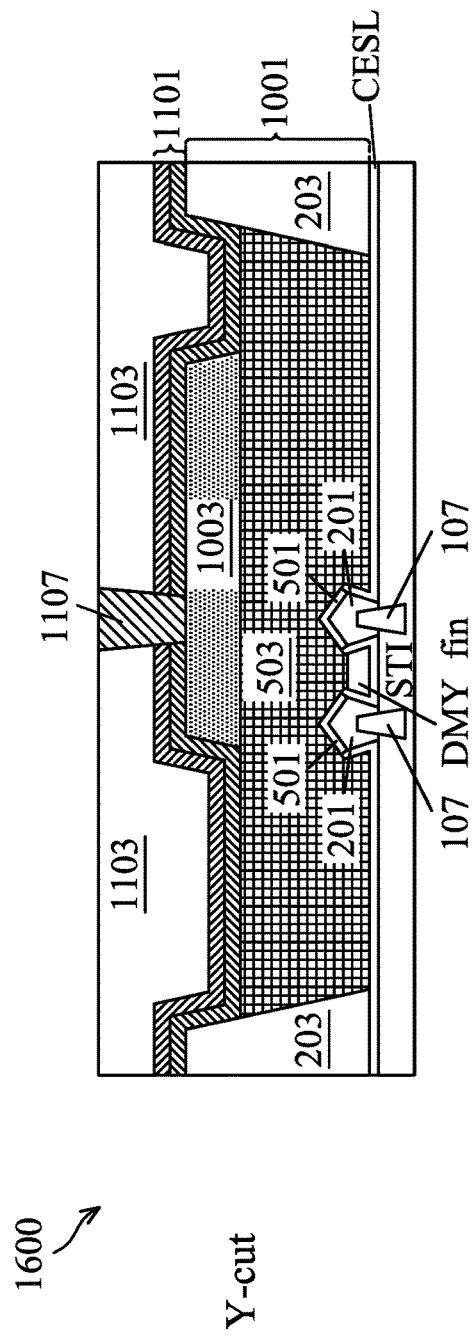
Figure 16A
Figure 16B

SEMICONDUCTOR DEVICE AND METHOD OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12 and 13A-16B illustrate top-down views and cross-section views through the semiconductor device, in accordance with some embodiments.

DETAILED DESCRIPTION

Figure 1A:
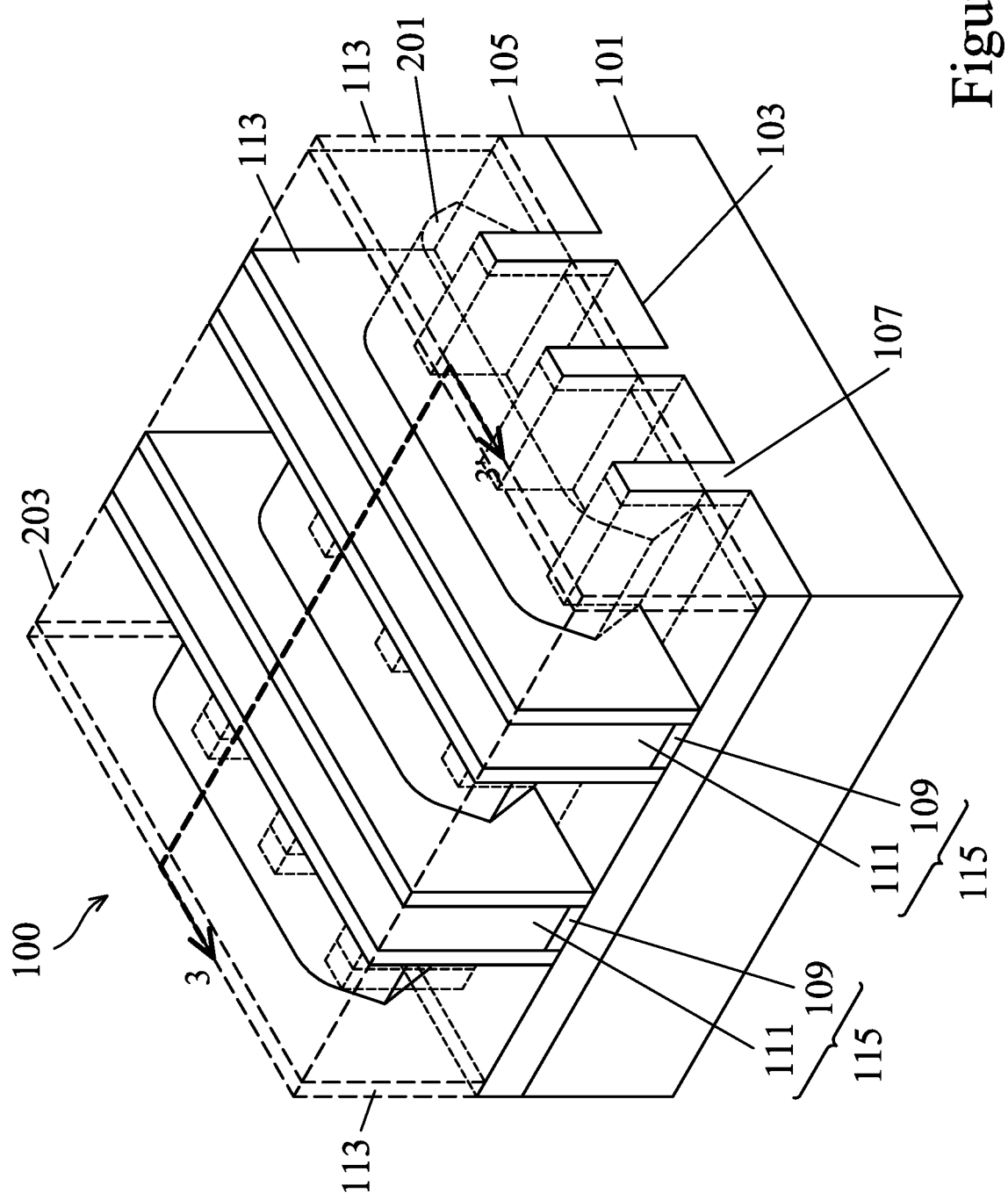
FIG. 1A illustrates a perspective view of an intermediate structure during a formation of semiconductor fins, a series of dummy gate electrode stacks, and an interlayer dielectric (ILD) layer in a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including finFET devices with reduced resistance/capacitance of an interface between a source/drain via and a source/drain contact and with an enhanced processing window between a gate via and a source/drain contact. However, embodiments are not limited to the examples provided herein, and the ideas may be implemented in a wide array of embodiments.

With reference now to FIG. 1A, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

In other embodiments the substrate 101 may be chosen to be a material which will specifically boost the performance (e.g., boost the carrier mobility) of the devices formed from the substrate 101. For example, in some embodiments the material of the substrate 101 may be chosen to be a layer of epitaxially grown semiconductor material, such as epitaxially grown silicon germanium which helps to boost some of the measurements of performance of devices formed from the epitaxially grown silicon germanium. However, while the use of these materials may be able to boost some of the performance characteristics of the devices, the use of these same materials may affect other performance characteristics of the device. For example, the use of epitaxially grown silicon germanium may degrade (with respect to silicon) the interfacial defects of the device.

The first trenches 103 may be formed as an initial step in the eventual formation of first isolation regions 105. The first trenches 103 may be formed using a masking layer (not separately illustrated in FIG. 1A) along with a suitable etching process. For example, the masking layer may be a hard mask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching processes additionally form fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three of the fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Furthermore, the fins 107 may be patterned by any suitable method. For example, the fins 107 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 107.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, dummy gate dielectrics 109, dummy gate electrodes 111 over the dummy gate dielectrics 109, and spacers 113 may be formed over each of the fins 107. In an embodiment the dummy gate dielectrics 109 may be formed by thermal oxidation, chemical vapor deposition, sputtering, or any other methods known and used in the art for forming a gate dielectric. Depending on the technique of gate dielectric formation, the dummy gate dielectrics 109 thickness on the top of the fins 107 may be different from the gate dielectric thickness on the sidewall of the fins 107.

The dummy gate dielectrics 109 may comprise a material such as silicon dioxide or silicon oxynitride with a thickness ranging from about 3 Å to about 100 Å, such as about 10 Å. The dummy gate dielectrics 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å, such as about 10 Å or less. Additionally, any combination of silicon dioxide, silicon oxynitride, and/or high-k materials may also be used for the dummy gate dielectrics 109.

The dummy gate electrodes 111 may comprise a conductive or non-conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrodes 111 may be deposited by chemical vapor deposition (CVD), sputter deposition, or other techniques known and used in the art for depositing conductive materials. The thickness of the dummy gate electrodes 111 may be in the range of about 5 Å to about 200 Å. The top surface of the dummy gate electrodes 111 may have a non-planar top surface, and may be planarized prior to patterning of the dummy gate electrodes 111 or gate etch. Ions may or may not be introduced into the dummy gate electrodes 111 at this point. Ions may be introduced, for example, by ion implantation techniques.

Once formed, the dummy gate dielectrics 109 and the dummy gate electrodes 111 may be patterned to form a series of dummy stacks 115 over the fins 107. The dummy stacks 115 define multiple channel regions located on each side of the fins 107 beneath the dummy gate dielectrics 109. The dummy stacks 115 may be formed by depositing and patterning a gate mask (not separately illustrated in FIG. 1) on the dummy gate electrodes 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrodes 111 and the dummy gate dielectrics 109 may be etched using a dry etching process to form the patterned in the dummy stacks 115.

Figure 1B:
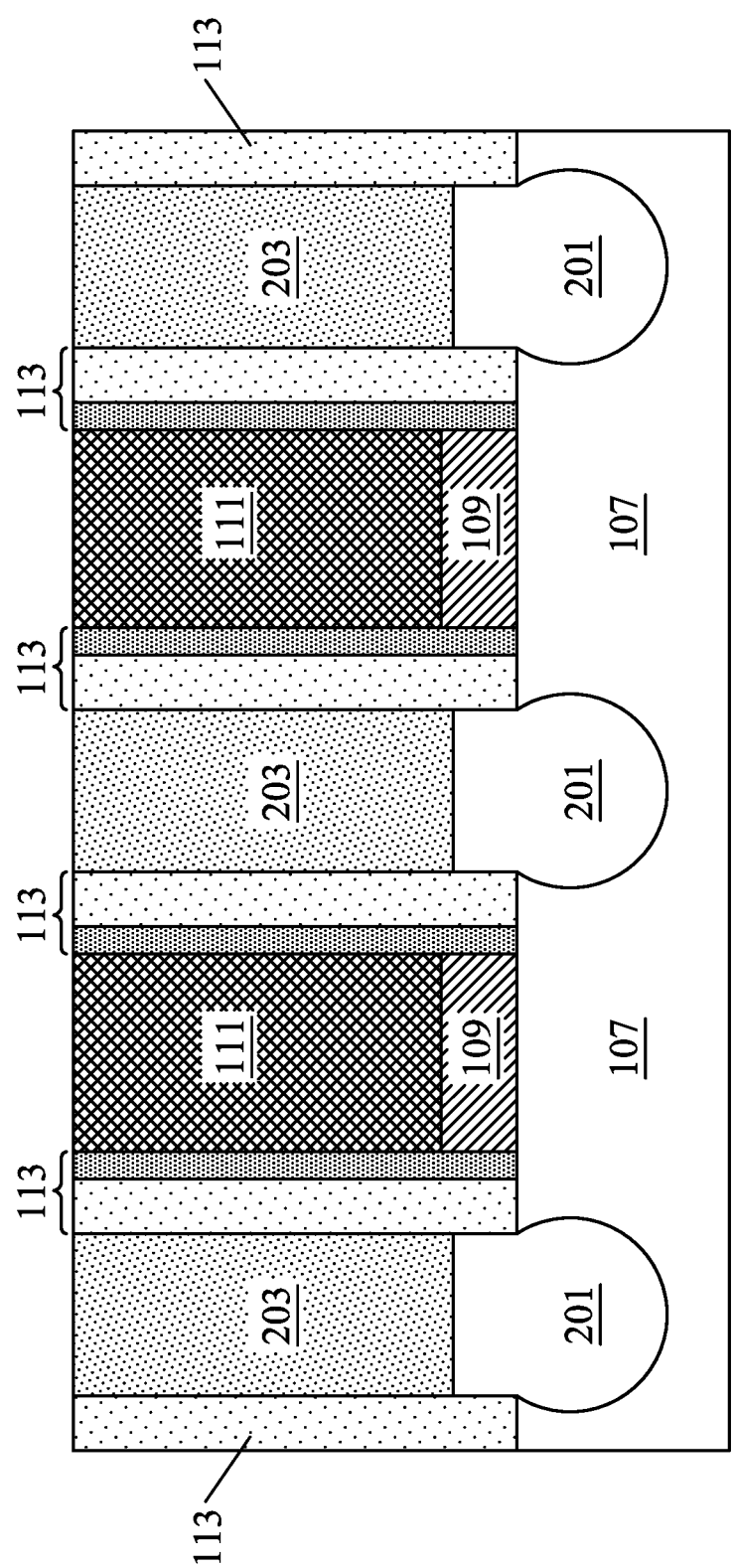
FIGS. 1B and 2-11 illustrate cross-sectional views through intermediate structures during further processing of the intermediate structure of FIG. 1 during formation of the semiconductor device, in accordance with some embodiments.

Once the dummy stacks 115 have been patterned, the spacers 113 may be formed. The spacers 113 may be formed on opposing sides of the dummy stacks 115. The spacers 113 may be formed by blanket depositing one (as illustrated in FIG. 1A for clarity) or more (as illustrated in FIG. 1B) spacer layers on the previously formed structure. The one or more spacer layers may comprise SiN, oxynitride, SiC, SiON, SiOCN, SiOC, oxide, and the like and may be formed by methods utilized to form such layers, such as chemical vapor deposition (CVD), plasma enhanced CVD, sputter, and other methods known in the art. In embodiments with more than one spacer layer, the one or more spacer layers may be formed in similar manners using similar materials, but different from one another, such as by comprising materials having different component percentages and with different curing temperatures and porosities. Furthermore, the one or more spacer layers may comprise a different material with different etch characteristics or the same material as the dielectric material within the first isolation regions 105. The one or more spacer layers may then be patterned, such as by one or more etches to remove the one or more spacer layers from the horizontal surfaces of the structure. As such, the one or more spacer layers are formed along sidewalls of the dummy stacks 115 and are collectively referred to as the spacers 113.

In an embodiment, the spacers 113 may be formed to have a thickness of between about 5 Å and about 500 Å. Additionally, once the spacers 113 have been formed, spacers 113 of adjacent stacks of the dummy stacks 115 may be separated from one another by a distance of between about 5 nm and about 200 nm, such as about 20 nm. However, any suitable thicknesses and distances may be utilized.

FIG. 1A further illustrates a removal of the fins 107 (although the location of the fins 107 is still illustrated in FIG. 1A to show where they were originally located) from those areas not protected by the dummy stacks 115 and the spacers 113 and a regrowth of source/drain regions 201. The removal of the fins 107 from those areas not protected by the dummy stacks 115 and the spacers 113 may be performed by a reactive ion etch (RIE) using the dummy stacks 115 and the spacers 113 as hard masks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrodes 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the dummy stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å and a height over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy stacks 115 and the spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrodes 111 during the formation of the source/drain regions 201 is removed. In an embodiment the hard mask may be removed using, e.g., a wet or dry etching process that is selective to the material of the hard mask. However, any suitable removal process may be utilized.

FIG. 1A also illustrates a formation of a first interlayer dielectric (ILD) layer 203 (illustrated in dashed lines in FIG. 1A in order to more clearly illustrate the underlying structures) over the dummy stacks 115 and the source/drain regions 201. The first ILD layer 203 may comprise a material such as boron phosphorous silicate glass (BPSG), although any suitable dielectrics may be used. The first ILD layer 203 may be formed using a process such as PECVD, although other processes, such as LPCVD, may alternatively be used. The first ILD layer 203 may be formed to a thickness of between about 100 Å and about 3,000 Å. Once formed, the first ILD layer 203 may be planarized with the spacers 113 using, e.g., a planarization process such as chemical mechanical polishing process, although any suitable process may be utilized.

FIG. 1B illustrates a cross-sectional view of FIG. 1A along cutline 3-3' in order to better illustrate the formation of gate contacts, gate vias, source/drain contacts, and source/drain vias, according to some embodiments.

Figure 2:
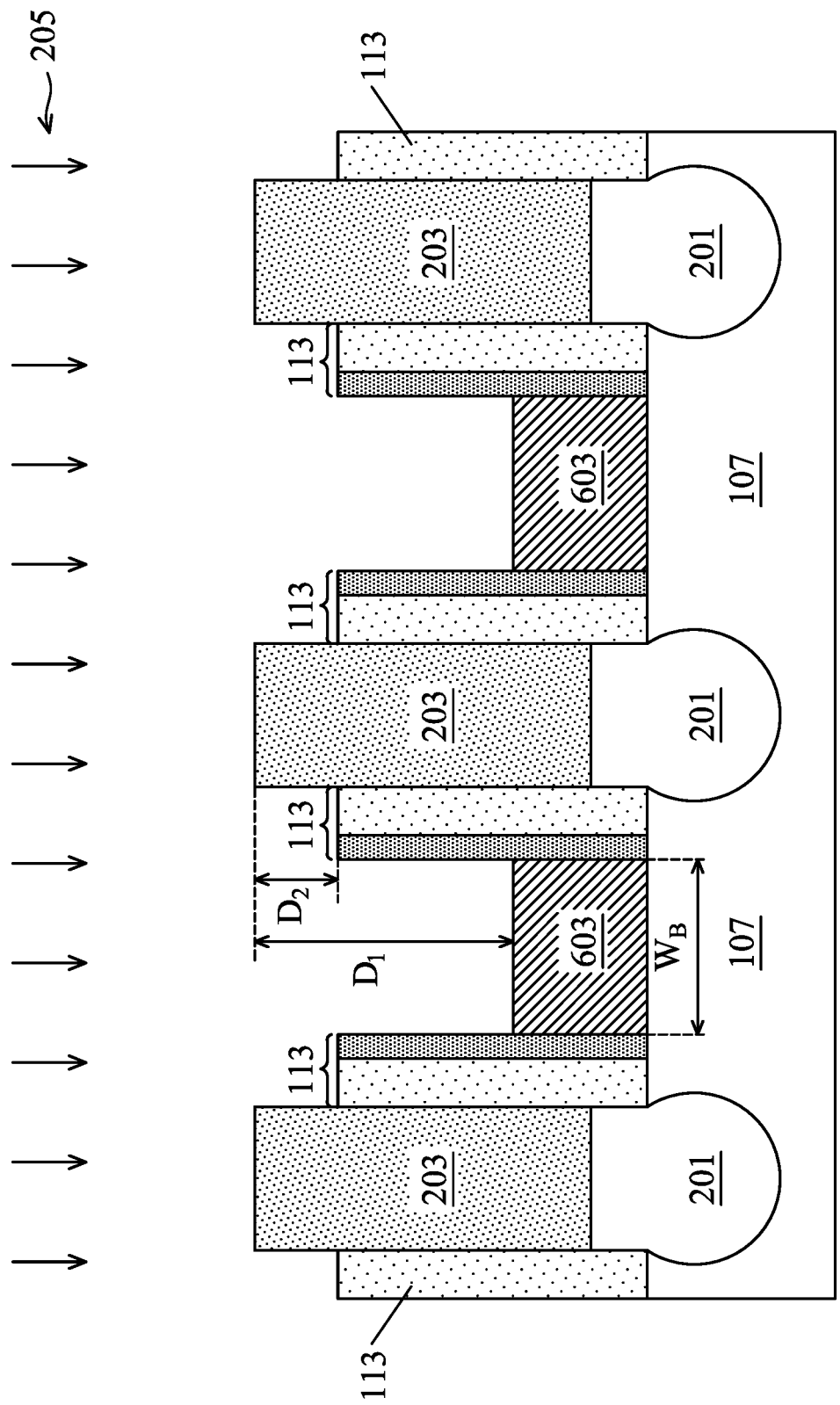

FIG. 2 illustrates a removal of the dummy gate electrode 111 and the dummy gate dielectric 109. In an embodiment, the dummy gate electrodes 111 and the dummy gate dielectrics 109 may be removed using, e.g., one or more wet or dry etching processes that utilize etchants that are selective to the materials of the dummy gate electrodes 111 and the dummy gate dielectrics 109. However, any suitable removal process or processes may be utilized.

Once the dummy gate electrodes 111 and the dummy gate dielectrics 109 have been removed, a plurality of layers for gate stacks (collectively labeled as gate stacks 603 in FIG. 2) are deposited in their stead, including a first dielectric material, a first conductive layer, a first metal material, a work function layer, and a first barrier layer. In an embodiment the first dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material may be deposited to a thickness of between about 5 Å and about 200 Å, although any suitable material and thickness may be utilized.

Optionally, an interfacial layer may be formed prior to the formation of the first dielectric material. In an embodiment the interfacial layer may be a material such as silicon dioxide formed through a process such as in situ steam generation (ISSG). However, any suitable material or process of formation may be utilized.

The first conductive layer may be a metal silicide material such as titanium silicon nitride (TSN). In an embodiment the first conductive layer may be formed using a deposition process such as chemical vapor deposition, although any suitable method of deposition, such as a deposition and subsequent silicidation, may be utilized to a thickness of between about 5 Å and about 30 Å. However, any suitable thickness may be utilized.

The first metal material may be formed adjacent to the first dielectric material as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The work function layer is formed over the first metal material, and the material for the work function layer may be chosen based upon the type of device desired. Exemplary p-type work function metals that may be included include Al, TiAlC, TiN, TaN, Ru, Mo, WN, $ZrSi_2$, $MoSi_2$, $TaSi_2$, $NiSi_2$, WN, other suitable p-type work function materials, or combinations thereof. Exemplary n-type work function metals that may be included include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a desired threshold voltage Vt is achieved in the device that is to be formed in the respective region. The work function layer(s) may be deposited by CVD, PVD, and/or other suitable process to a thickness of between about 5 Å and about 50 Å.

The first barrier layer may be formed adjacent to the work function layer and, in a particular embodiment, may be similar to the first metal material. For example, the first barrier layer may be formed from a metallic material such as TiN, Ti, TiAlN, TaC, TaCN, TaSiN, Mn, Zr, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first barrier layer may be deposited using a deposition process such as atomic layer deposition, chemical vapor deposition, sputtering, or the like, to a thickness of between about 5 Å and about 200 Å, although any suitable deposition process or thickness may be used.

The metal layer may be a material that is both suitable for use as a seed layer to help a subsequent filling process as well as a material that can be used to help block or reduce the transport of fluorine atoms into the work function layer. In a particular embodiment, the metal layer may be crystalline tungsten (W) that is formed free from the presence of fluorine atoms using, e.g., an atomic layer deposition process, although any suitable deposition process may be utilized. The metal layer may be formed to a thickness of between about 20 Å and about 50 Å, such as between about 30 Å and about 40 Å.

Once the metal layer has been formed, a fill material is deposited to fill a remainder of the opening. In an embodiment the fill material may be a material such as Al, Cu, AlCu, W, Ti, TiAlN, TaC, TaCN, TaSiN, Mn, Zr, TiN, Ta, TaN, Co, Ni, combinations of these, or the like, to a thickness of between about 1000 Å and about 2000 Å, such as about 1500 Å. However, any suitable material may be utilized.

After the fill material has been deposited to fill and overfill the openings, the materials of the first dielectric material, first conductive layer, first metal material, work function layer, first barrier layer, metal layer, and fill material may be planarized to form a gate stack 603. In an embodiment the materials may be planarized with the first ILD layer 203 using, e.g., a chemical mechanical polishing process, although any suitable process, such as grinding or etching, may be utilized. Additionally, after the planarization the gate stack 603 may have a bottom width $W_B$ of between about 10 nm and about 13 nm, such as about 11 nm, although any suitable dimensions may be utilized.

FIG. 2 further illustrates a recessing of the gate stacks 603. After the materials of the gate stacks 603 have been formed and planarized, the materials of the gate stacks 603 may be recessed using an etch back process 205 (represented by directional arrows in FIG. 2) that utilizes etchants selective to the materials of the gate stacks 603. The etch back process 205 may be a wet or dry etching process utilizing etchants selective to the materials of the gate stacks 603. In some embodiments the materials of the gate stacks 603 may be recessed a first distance $D_1$ of between about 5 nm and about 150 nm, such as about 120 nm. However, any suitable etching process using any suitable etchants and any suitable distances may be utilized.

During the recessing of the gate stacks 603, the spacers 113 may also be recessed, although the recessing may be less than the recessing of the gate stacks 603. As such, in an embodiment the spacers 113 may be recessed a second distance $D_2$ of between about 1 nm and about 10 nm, such as about 5 nm. However, any suitable distance may be utilized.

Figure 3:
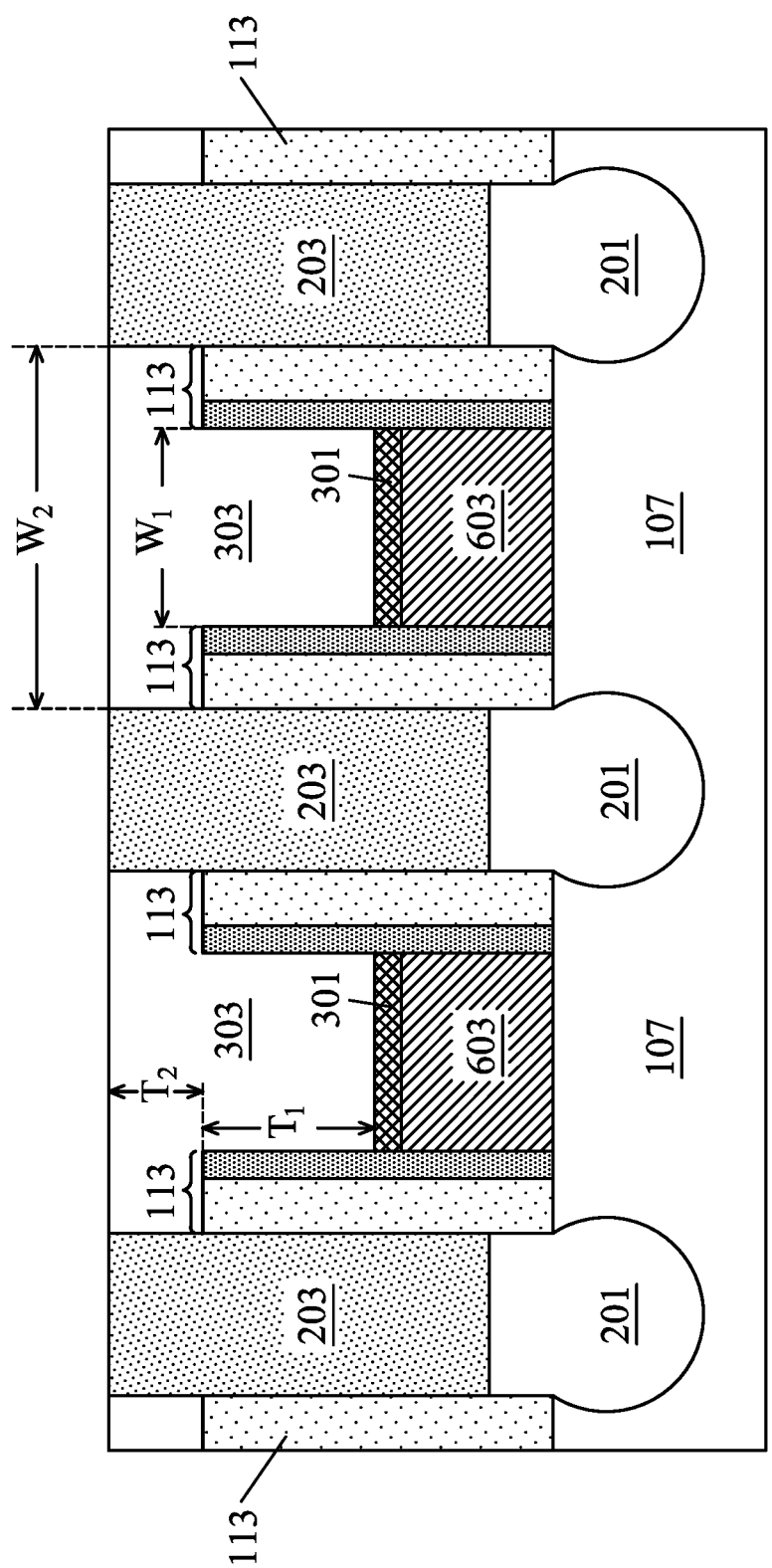

FIG. 3 illustrates a deposition of a first metal layer 301 and a first hard mask layer 303 over the first metal layer 301. Once the materials of the gate stack 603 have been recessed, the first metal layer 301 (e.g., capping layer) is deposited in order to act as an etch stop layer for subsequent processing (described further below). In an embodiment the first metal layer 301 is a metal material such as tungsten (W), cobalt (Co), aluminum (Al), zirconium (Zr), gold (Au), platinum (Pt), copper (Cu), ruthenium (Ru), alloys of these metal materials, and the like and is formed using, e.g., an atomic layer deposition process which will selectively grow on the material of the gate stack 603 without forming on other exposed surfaces. The first metal layer 301 may be formed to a thickness of between about 1 nm and about 10 nm, such as about 3 nm. However, any suitable material, process of formation, and thickness may be utilized.

In an embodiment the first hard mask layer 303 is a material with a high etch selectivity to other materials used to form the gate stack 603, the first metal layer 301, the first ILD layer 203, and the spacers 113 (e.g., oxides such as silicon oxide ($SiO_2$) and nitrides such as silicon nitride (SiN)). The first hard mask layer 303 also has a high etch selectivity to the materials of a second metal layer used to form a plurality of source/drain contacts 503 and a second hard mask material of isolation regions 803 (not illustrated in FIG. 3 but illustrated and described in detail below with respect to FIGS. 5 and 8, respectively). As such, the first hard mask layer 303 may serve as an etching mask without requiring another etch stop layer and with little residual material when etching any of the materials to which the first hard mask layer 303 has a high etch selectivity.

Additionally, in some embodiments the first hard mask layer 303 may also be a dielectric material with good chemical mechanical polishing properties that helps to increase the integration flexibility in advanced technology nodes. In a particular embodiment the first hard mask layer 303 may be a material such as silicon nitride (SiN), although other suitable materials, such as silicon oxide ($SiO_2$), aluminum oxide (AlO), silicon oxycarbide (SiOC), silicon carbon (SiC), zirconium nitride (ZrN), zirconium oxide (ZrO), combinations of these, or the like, may also be utilized. The first hard mask layer 303 may be deposited using a deposition process such as plasma enhanced atomic layer deposition (PEALD), thermal atomic layer deposition (thermal ALD), plasma enhanced chemical vapor deposition (PECVD), wherein the process temperature can be held to be between about 250° C. and about 400° C. However, any suitable deposition process and process conditions may be utilized.

By using such materials, the height of the gate may be protected while still helping to reduce or prevent etch loss or damage from occurring during subsequent etching processes (discussed further below). Additionally, by utilizing these materials, a high oxide etch selectivity on small CD and high aspect ratio oxide etches may be achieved. Also, these materials provide high etch selectivity during subsequent etching of the second hard mask material of isolation regions 803, while still providing a wide etch process window.

Once the first hard mask layer 303 has been deposited, the first hard mask layer 303 may be planarized to remove excess material. In an embodiment the first hard mask layer 303 may be planarized using, e.g., a chemical mechanical polishing process, whereby etchants and abrasives are utilized along with a rotating platen in order to react and remove the excess material of the first hard mask layer 303. However, any suitable planarization process may be utilized to planarize the first hard mask layer 303 and the first ILD layer 203.

By planarizing the first hard mask layer 303 with the first ILD layer 203, the first hard mask layer 303 is formed to have two portions: a first portion located within the spacers 113 and a second portion located outside of the spacers 113 within the first ILD layer 203. In an embodiment the first portion has a first width $W_1$ of between about 12 nm and about 15 nm, such as about 12 nm, and has a first thickness $T_1$ of between about 20 nm and about 30 nm, such as about 22 nm. Additionally, the second portion has a second width $W_2$ of between about 20 nm and about 28 nm, such as about 22 nm, and a second thickness $T_2$ of between about 14 nm and about 26 nm, such as about 16 nm. However, any suitable dimensions may be utilized.

Figure 4:
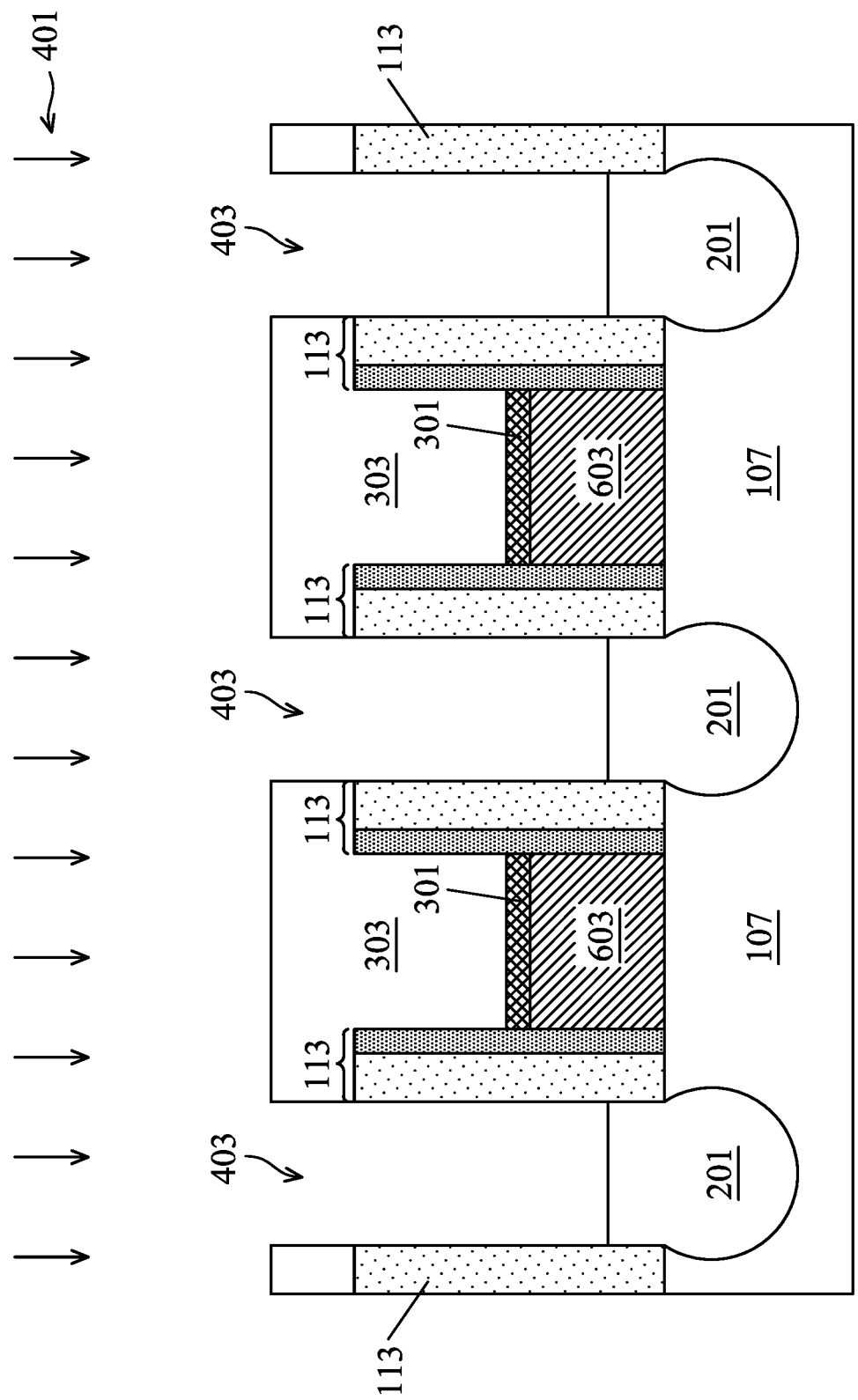

FIG. 4 illustrates an etch-through process 401 (represented by directional arrows in FIG. 4) to form source/drain via openings 403 through the first ILD layer 203 to expose the source/drain regions 201. In some embodiments, the first hard mask layer 303 and the spacers 113 may be used as a mask and the etch-through process 401 comprises performing one or more reactive ion etching (RIE) processes using etchants that are selective to the materials of the first ILD layer 203. However, any suitable etchants may be utilized.

Furthermore, the etch-through process 401 may be performed using other masks without departing from the spirit of the embodiments disclosed herein. For example, other masks may be formed, for example, from one or more other hard mask layers deposited over the first hard mask layer 303 and are then patterned using, e.g., a photolithographic masking and etching process. For example, a single or tri-layer photoresist is applied over the one or more other hard mask layers, exposed, and developed to form a desired pattern. Once the desired pattern has been formed in the photoresist, one or more etching processes may be used to transfer the pattern of the photoresist into the underlying one or more other hard mask layers and the patterned one or more other hard mask layers may be used as a mask to perform the etch-through process 401. However, any suitable process may be utilized to form source/drain via openings 403 through the first ILD layer 203 to expose the source/drain regions 201.

Figure 5:
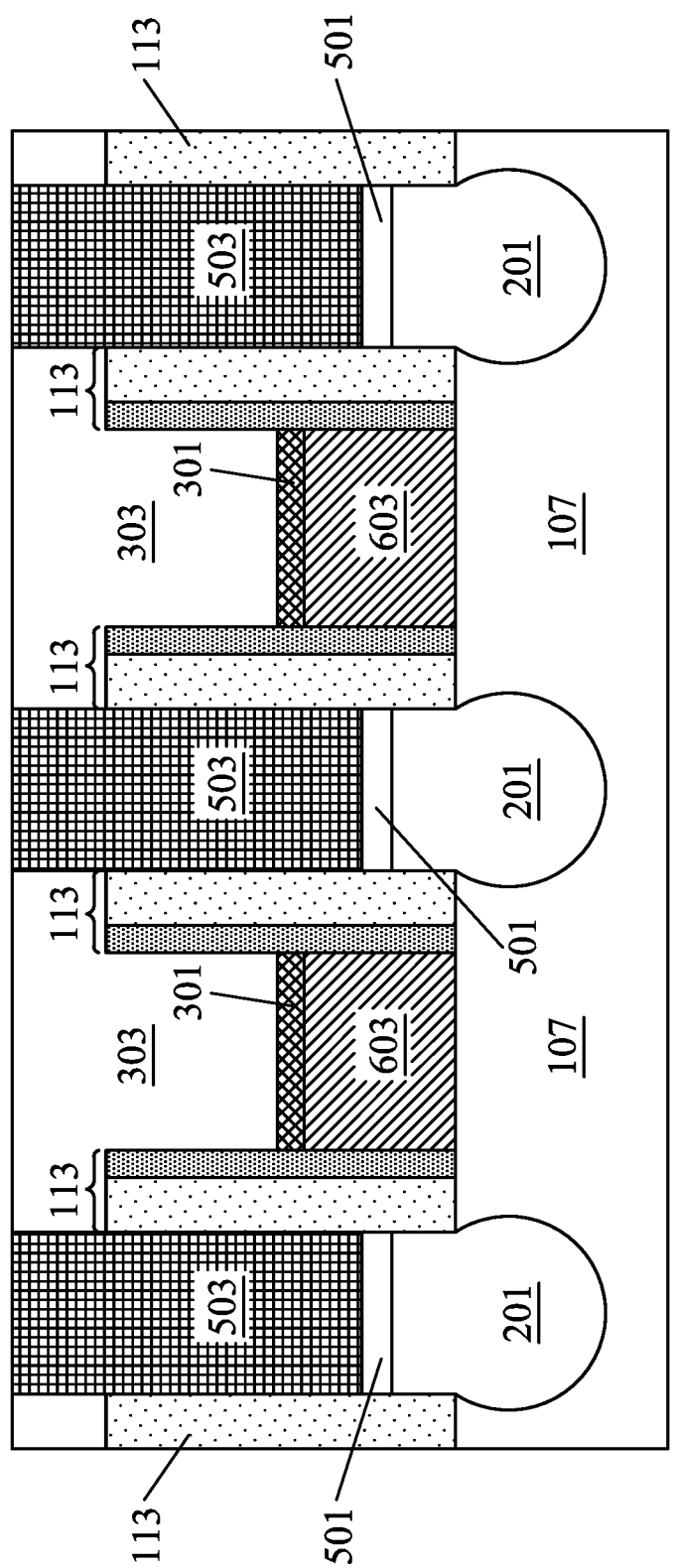

FIG. 5 illustrates that once the source/drain regions 201 have been exposed, an optional silicide contact 501 may be formed on the source/drain regions 201. The optional silicide contact 501 may comprise titanium (e.g., titanium silicide (TiSi)) in order to reduce the Schottky barrier height of the contact. However, other metals, such as nickel, cobalt, erbium, platinum, palladium, and the like, may also be used. A silicidation may be performed by blanket deposition of an appropriate metal layer, followed by an annealing step which causes the metal to react with the underlying exposed silicon of the source/drain regions 201. Un-reacted metal is then removed, such as with a selective etch process. The thickness of the optional silicide contact may be between about 5 nm and about 50 nm.

FIG. 5 also illustrates a formation of the second metal layer of the source/drain contacts 503 in physical connection with the optional silicide contact (when present) or the source/drain regions 201. In an embodiment the second metal layer used for the source/drain contacts 503 may be a conductive material such as W, Al, Cu, AlCu, W, Co, TaC, TaCN, TaSiN, Mn, Zr, TiN, Ta, TaN, Ni, Ti, TiAlN, Ru, Mo, or WN, although any suitable material, such as aluminum, copper, alloys of these, combinations of these, or the like, and may be deposited using a deposition process such as sputtering, chemical vapor deposition, electroplating, electroless plating, or the like, to fill and/or overfill the opening within the first hard mask layer 303.

Once the second metal layer has been deposited, the second metal layer of the source/drain contacts 503 may be planarized with the first hard mask layer 303 to remove excess material and to separate the second metal layer into a plurality of distinct contacts of the source/drain contacts 503 corresponding to respective regions of the source/drain regions 201. In an embodiment the second metal layer of the source/drain contacts 503 may be planarized using, e.g., a chemical mechanical polishing process, whereby etchants and abrasives are utilized along with a rotating platen in order to react and remove the excess material of the second metal layer of the source/drain contacts 503 and/or the material of the first hard mask layer 303. However, any suitable planarization process may be utilized to planarize the second metal layer used for the source/drain contacts 503 with the first hard mask layer 303 and to separate the second metal layer into the plurality of distinct contacts of the source/drain contacts 503. As such, a plurality of contact regions of the second metal layer corresponding to the plurality of distinct contacts of the source/drain contacts 503 are planarized with and exposed in the first hard mask layer 303.

Figure 6:
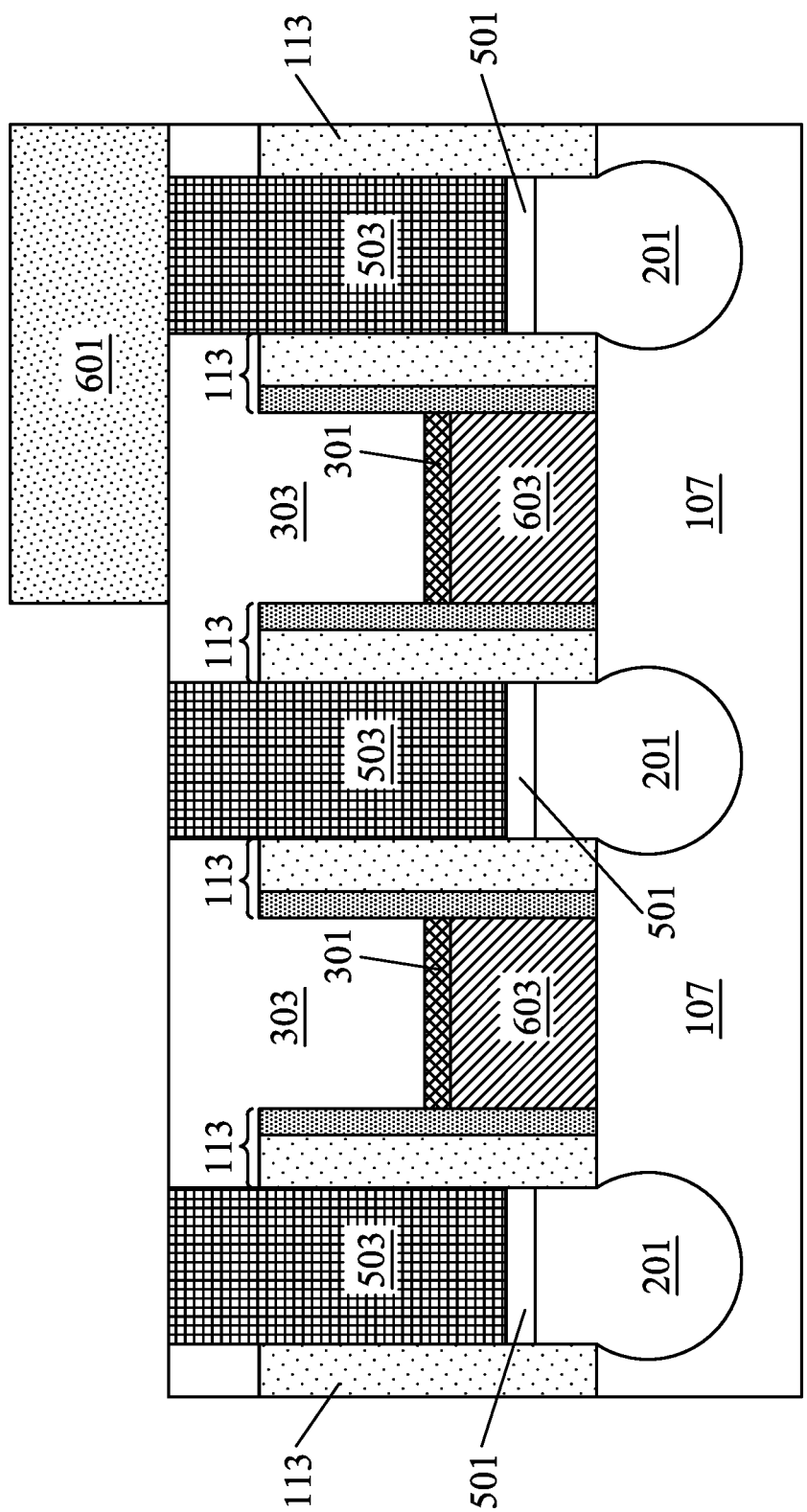

FIG. 6 illustrates a deposition and patterning of a photo mask 601 formed over the planarized surface of the second metal layer used for the source/drain contacts 503 with the first hard mask layer 303, in preparation for further processing. According to some embodiments, a single or tri-layer photoresist is applied over the planarized surface of the second metal layer used for the source/drain contacts 503 with the first hard mask layer 303. Once applied, the photoresist is exposed and then developed to form a desired pattern in the photo mask 601. In some embodiments, some surface areas of the second metal layer used for the source/drain contacts 503 are exposed through the pattern of the photo mask 601 and some of the surface areas of the second metal layer used for the source/drain contacts 503 remain covered by the photo mask 601.

Figure 7:
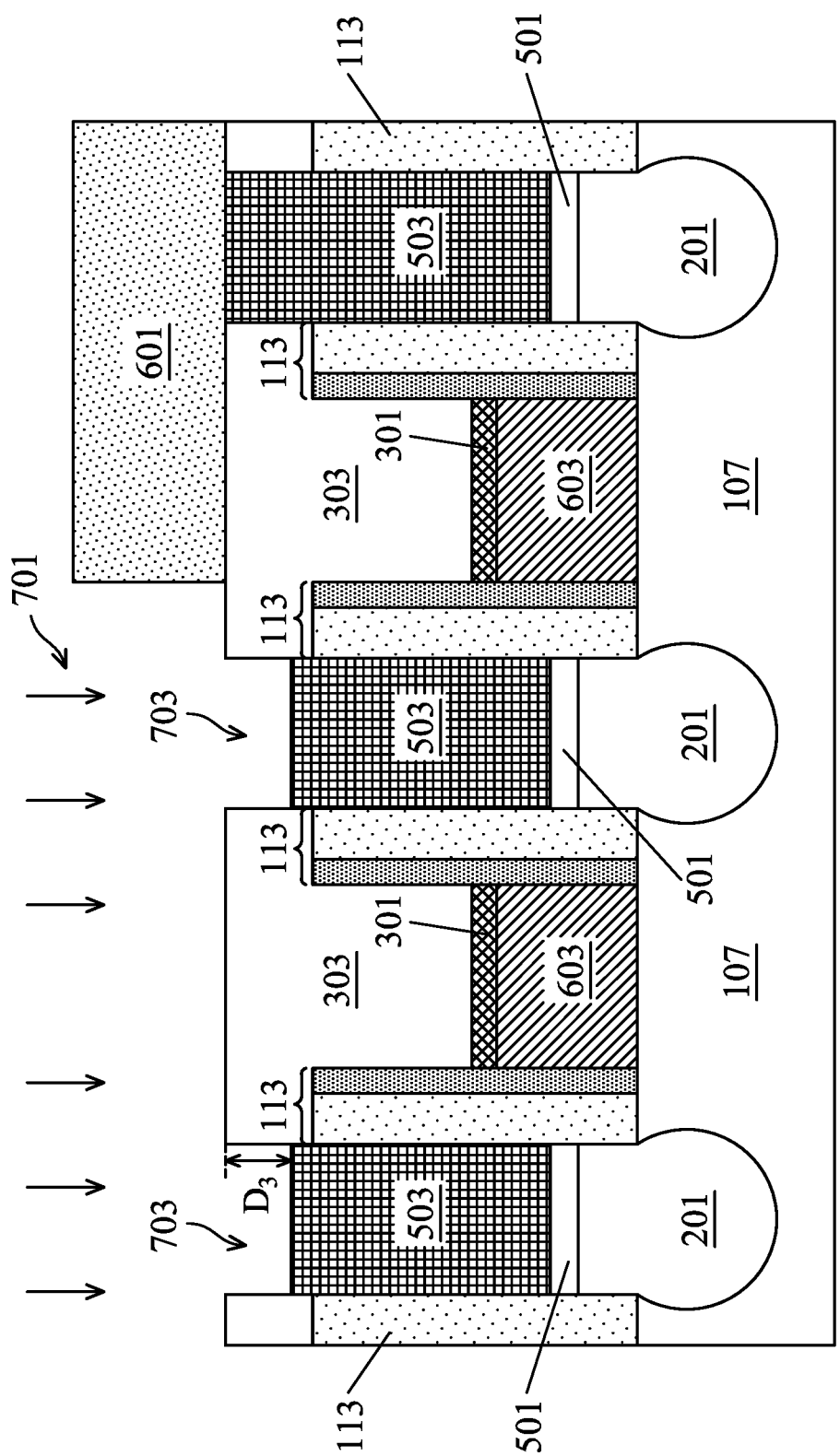

FIG. 7 illustrates, according to some embodiments, the recessing of the second metal layer of the source/drain contacts 503 that are exposed through the photo mask 601. According to some embodiments, the photo mask 601 and the first hard mask layer 303 are used as a mask and the second metal layer of the source/drain contacts 503 is recessed using an etching process 701 (e.g., a wet etch, dry etch, or the like) to a level below the planar surface of the first hard mask layer 303. In an embodiment the second metal layer used for the source/drain contacts 503 is recessed using one or more etchants that are selective to the material of the second metal layer (e.g., cobalt) without significantly removing the material of the first hard mask layer 303. As such, first recesses 703 are formed into the exposed source/drain contacts 503 of the second metal layer; whereas, the source/drain contacts 503 protected by the photo mask 601 remain planarized with the first hard mask layer 303. According to an embodiment, the first recesses 703 are formed to a third depth $D_3$ of between about 1 nm and about 20 nm, such as about 10 nm. However, any suitable depth may be utilized.

Figure 8:
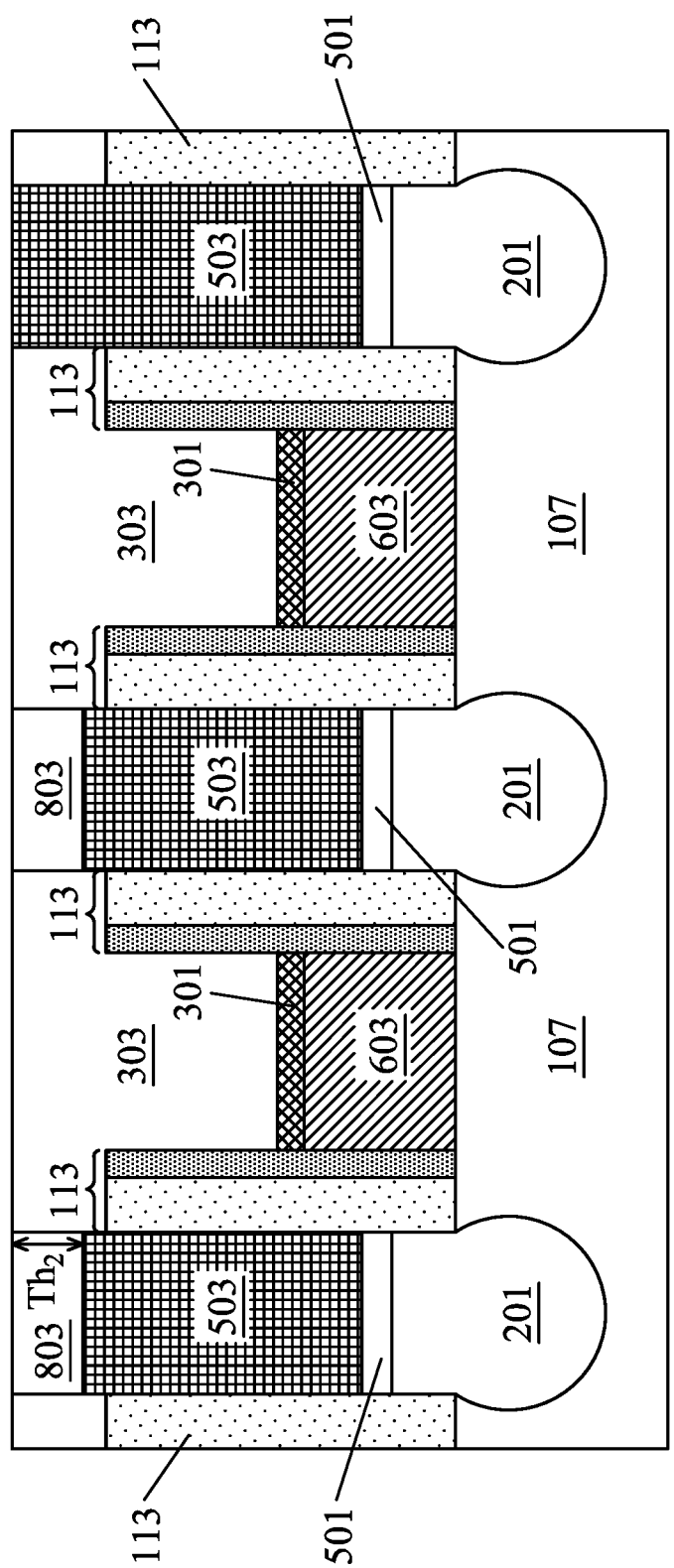

FIG. 8 illustrates a removal of the photo mask 601 (e.g., via ashing) and a deposition of the second hard mask material of isolation regions 803 into the first recesses 703. In an embodiment the second hard mask material of isolation regions 803 may be a material with a high etch selectivity relative to the etch selectivity of the materials of the first hard mask layer 303 and the spacers 113. For example, the material of the second hard mask material of isolation regions 803 may have an etch selectivity relative to the etch selectivity of the material of the first hard mask layer 303 and the spacers 113 of greater than about 12, such as between about 12 and about 40.

According to some embodiments, the second hard mask material of isolation regions 803 may be formed as a single layer or may be formed as a multi-layered dielectric stack and may be formed from one or more materials including: a high-k dielectric material (e.g., k>4), a low-k dielectric material (e.g., k<4), and/or a metal oxide material. The second hard mask material of isolation regions 803 may be formed using high-k dielectric materials (e.g., k>4) such as $SiO_x$, SiN, SiON, SiOCN, SiCN, silicon-compounds, nitride-compounds, oxide-compounds, combinations of these, or the like. The second hard mask material of isolation regions 803 may be formed using low-k dielectric materials (e.g., k<4) such as SiLK, Black diamond, combinations of these or the like. Furthermore, the second hard mask material of isolation regions 803 may also be formed using metal oxide materials such as $ZrO_2$, $AlO_x$, combinations of these, or the like. However, any suitable materials may be utilized. The second hard mask material of isolation regions 803 may be deposited using a deposition process such as plasma enhanced atomic layer deposition (PEALD), thermal atomic layer deposition (thermal ALD), plasma enhanced chemical vapor deposition (PECVD), wherein the process temperature can be held to be between about 250° C. and about 400° C. However, any suitable deposition and process conditions may be utilized.

The second hard mask material of isolation regions 803 may be formed to fill and overfill the first recesses 703 formed in the recessed source/drain contacts 503 of the second metal layer. Once the second hard mask material of isolation regions 803 has been deposited, the second hard mask material of isolation regions 803 may be planarized with the first hard mask layer 303 using, e.g., a planarization process such as a chemical mechanical polishing process, although any suitable process may be utilized. According to some embodiments, the second hard mask material of isolation regions 803 may be formed to a first thickness $Th_1$ of between about 0.5 nm and about 20 nm. As such, the second hard mask material of isolation regions 803 serves as isolation regions of the recessed source/drain contacts 503 of the second metal layer and is discussed in greater detail below.

Figure 9:
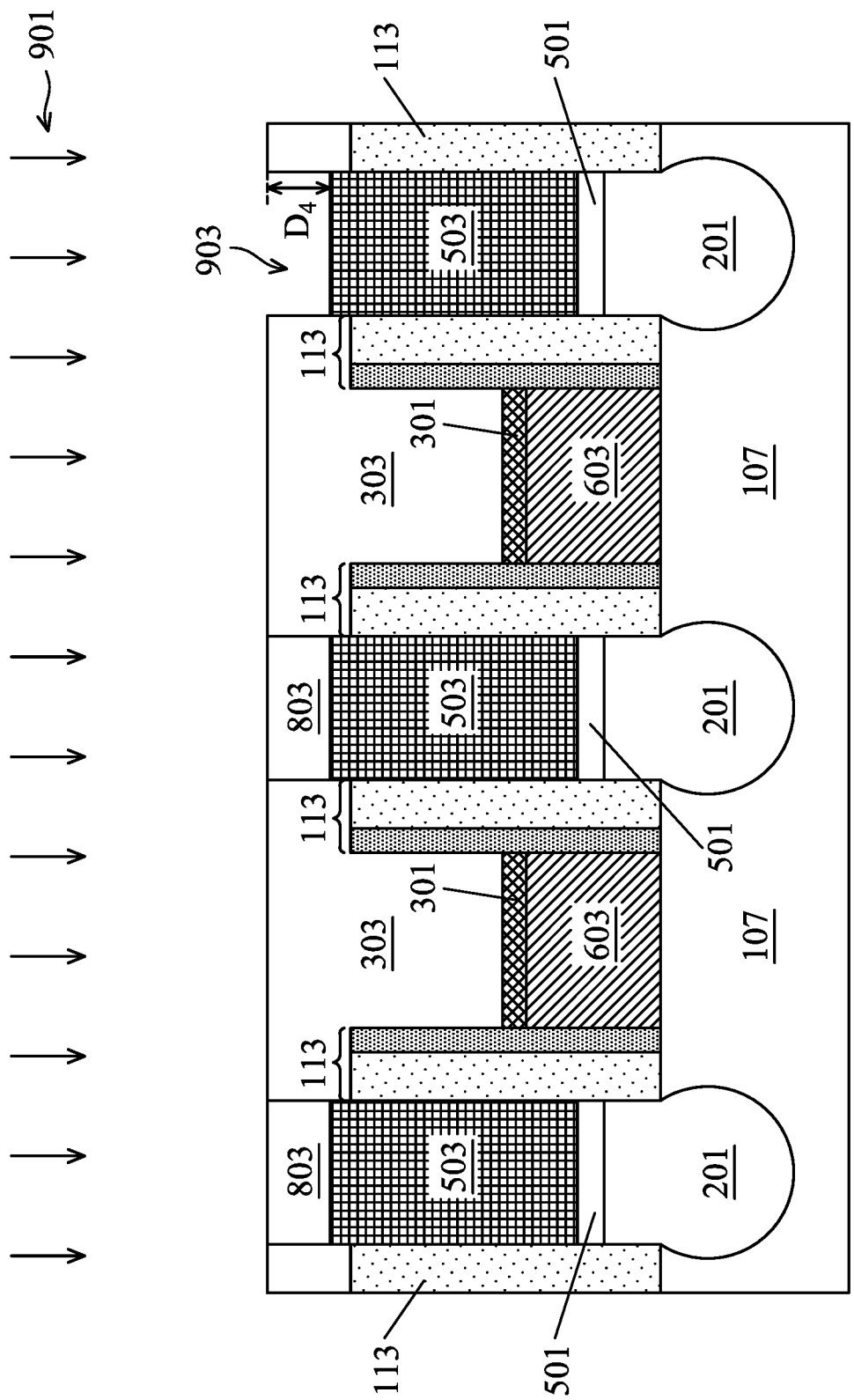

FIG. 9 illustrates a formation of second recesses 903 in the remaining one or more source/drain contacts 503 of the second metal layer that were protected by the photo mask 601 during the recessing of the one or more exposed source/drain contacts 503 of the second metal layer. According to some embodiments, the first hard mask layer 303 and the second hard mask material of isolation regions 803 are used as a mask and the remaining one or more source/drain contacts 503 of the second metal layer are recessed using an etching process 901 (e.g., a wet etch, dry etch, or the like) to a level below the planar surface of the first hard mask layer 303. In an embodiment the second metal layer of the source/drain contacts 503 is recessed using one or more etchants that are selective to the material of the second metal layer used for the source/drain contacts 503 (e.g., cobalt) without significantly removing the materials of the first hard mask layer 303 and the second hard mask material of isolation regions 803. As such, second recesses 903 are formed into the exposed surfaces of the remaining one or more source/drain contacts 503 of the second metal layer to a fourth depth $D_4$ of between about 10 nm and about 40 nm, such as about 28 nm. However, any suitable depth may be utilized.

Figure 10:
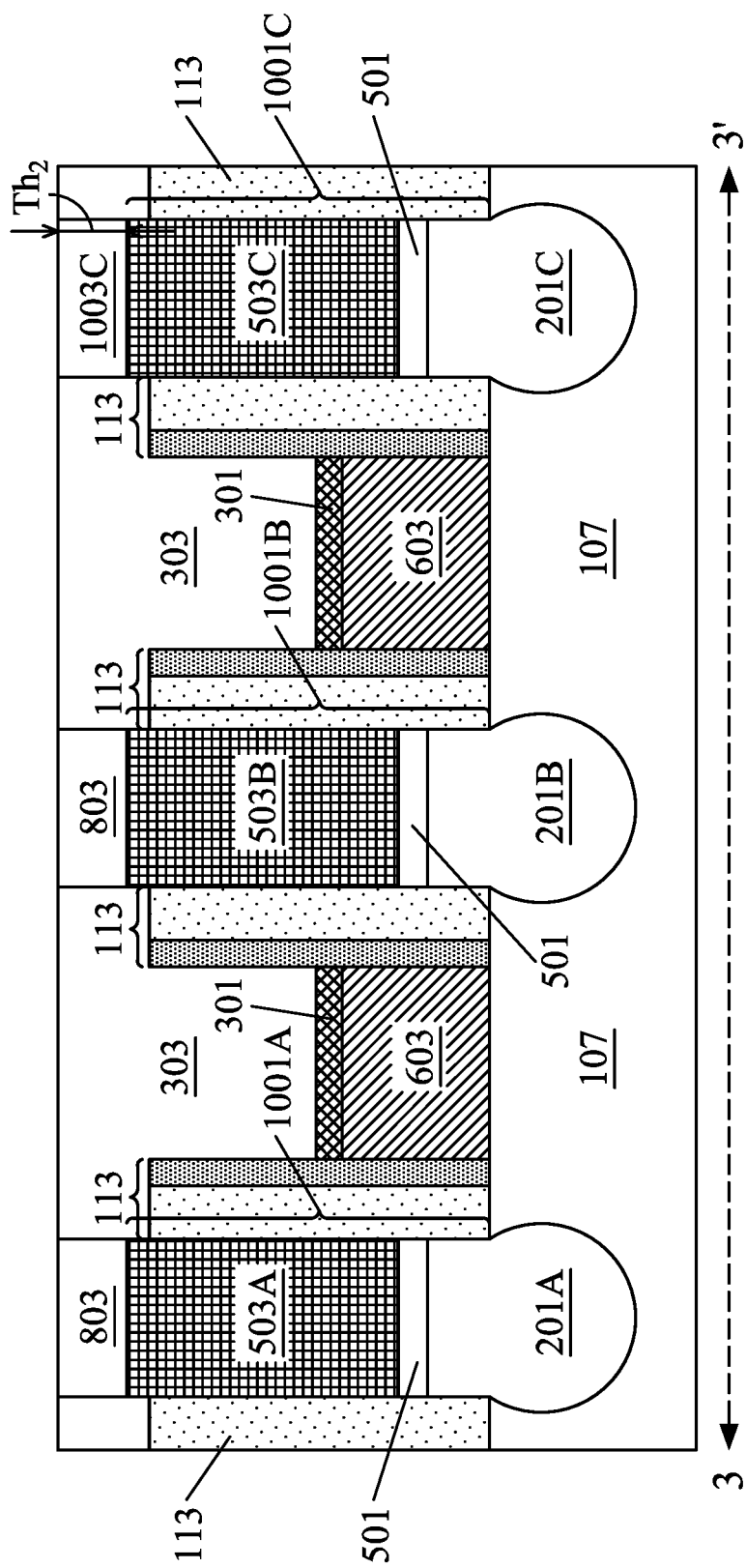

FIG. 10 illustrates a formation of a third metal layer used for the source/drain metal risers 1003 in physical connection with the one or more remaining source/drain contacts 503 of the second metal layer. According to embodiments disclosed herein, the third metal layer used for the source/drain metal risers 1003 is a conductive material that is different from the material of the second metal layer used for the source/drain contacts 503. The third metal layer used for the source/drain metal risers 1003 may be a material such as W, Al, Cu, AlCu, TaC, TaCN, TaSiN, Mn, Zr, TiN, Ta, TaN, Ni, Ti, TiAlN, Ru, Mo, WN or Co, although any suitable material, such as aluminum, copper, alloys of these, combinations of these, or the like may be utilized. The third metal layer used for the source/drain metal risers 1003 may be deposited using a deposition process such as sputtering, chemical vapor deposition, atomic layer deposition (ALD), electroplating, electroless plating, or the like, to fill and/or overfill the second recesses 903 formed in the remaining one or more source/drain contacts 503 of the second metal layer. However, any suitable materials and any suitable deposition process may be utilized.

Once the third metal layer used for the source/drain metal risers 1003 has been deposited, the third metal layer used for the source/drain metal risers 1003 may be planarized with the first hard mask layer 303 to remove excess material and to separate the third metal layer into a plurality of distinct metal risers to form the source/drain metal risers 1003 (e.g., 1003A, 1003B, and 1003C) corresponding to respective contacts (e.g., 503A, 503B, and 503C) of the source/drain contacts 503. FIG. 10 further illustrates, in the cross-sectional view taken through the cutline 3-3' of FIG. 1, a third source/drain metal riser 1003C formed over and in physical contact with the third source/drain contact 503C. Although not specifically illustrated in FIG. 10, it is understood that the first source/drain metal riser 1003A and the second source/drain metal riser 1003B would be seen (e.g., in other cross-sectional views taken through other cut lines) formed over and in physical contact with the first source/drain contacts 503A and the second source/drain contact 503B, respectively, and are discussed in greater detail below with regard to the following figures. In an embodiment the third metal layer used for the source/drain metal risers 1003 may be planarized using, e.g., a chemical mechanical polishing process, whereby etchants and abrasives are utilized along with a rotating platen in order to react and remove the excess material of the third metal layer used for the source/drain metal risers 1003, the materials of the first hard mask layer 303 and/or the materials of the second hard mask material of isolation regions 803. As such, the third metal layer used for the source/drain metal risers 1003 may be formed to a second thickness $Th_2$ of between about 0.5 nm and about 20 nm. However, any suitable planarization process and any suitable dimensions may be utilized to planarize the third metal layer used for the source/drain metal risers 1003 with the first hard mask layer 303 and the second hard mask material of isolation regions 803 to separate the third metal layer into distinct metal risers to form the source/drain metal risers 1003 (e.g., 1003A, 1003B, and 1003C).

Collectively, the third source/drain metal riser 1003C, the third source/drain contact 503C, and (if present) the optional silicide contact 501 form a third source/drain contact stack 1001C of the third source/drain region 201C, according to some embodiments. According to some embodiments, the material of the third source/drain metal riser 1003C is different from the material of the third source/drain contact 503C. As such, the third source/drain contact stack 1001C may be referred to herein as a hybrid source/drain contact stack. Furthermore, in the cross-section illustrated in FIG. 10, the first source/drain metal riser 1003A and the first source/drain contact 503A form a first source/drain contact stack 1001A of the first source/drain region 201A and the second source/drain metal riser 1003B and the second source/drain contact 503B form a second source/drain contact stack 1001B of the second source/drain region 201B. The first source/drain contact stack 1001A, the second source/drain contact stack 1001B, and the third source/drain contact stack 1001C are collectively referred to herein as source/drain contact stacks 1001. Furthermore, portions of the second hard mask material serve as isolation regions 803 overlying corresponding contact stacks of the source/drain contact stacks 1001 (e.g., 1001A, 1001B, and 1001C). Although not specifically illustrated in FIG. 10, it is understood that a third isolation region 803 would be seen overlying the third source/drain contact stack 1001C in other cross-sectional views taken through other cut lines and is discussed in greater detail below with regard to the following figures. According to some embodiments, the heights of the isolation regions 803 (e.g., first thickness $Th_1$ of 803 of FIG. 8) may be directly correlated with the heights of the first source/drain metal riser 1003A, the second source/drain metal riser 1003B, and the third source/drain metal riser 1003C (e.g., second thickness $Th_2$ of 1003C of FIG. 10), respectively and is discussed in greater detail below.

Figure 11:
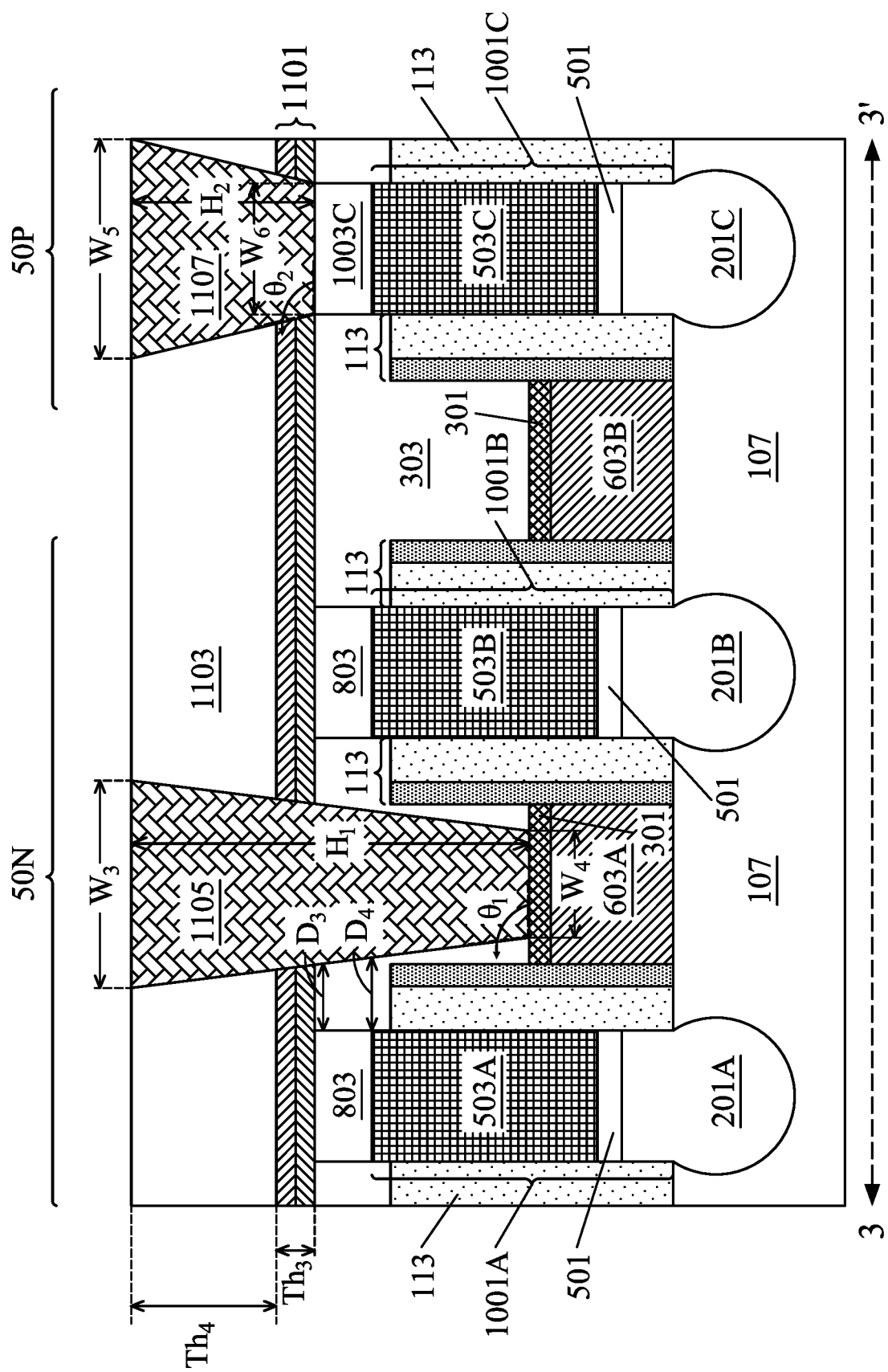

FIG. 11 illustrates, according to some embodiments, a formation of a CESL 1101 and a second ILD layer 1103 over the planarized surfaces of the third metal layer used for the source/drain metal risers 1003 with the first hard mask layer 303 and the second hard mask material of isolation regions 803. FIG. 11 further illustrates, according to some embodiments, formations of a gate via contact 1105 and a source/drain via contact 1107 that are formed through the second ILD layer 1103 and the CESL 1101. The gate via contact 1105 is formed over and electrically coupled to a first gate stack 603A of the gate stacks 603 and the source/drain via contact 1107 is formed over and electrically coupled to the third source/drain region 201C of the source/drain regions 201.

After the third metal layer used for the source/drain metal risers 1003 has been deposited and planarized with the first hard mask layer 303 and the second hard mask material of isolation regions 803, the contact etch stop layer (CESL) 1101 is deposited over the third metal layer used for the source/drain metal risers 1003. According to some embodiments, the CESL 1101 may be formed as a single layer or may be formed as a plurality of etch stop layers using materials such as silicon nitride, silicon oxycarbide, aluminum oxide, combinations of these, or the like, and may be blanket deposited and/or conformally deposited over any of the exposed surfaces of the source/drain contacts 503, the third metal layer used for the source/drain metal risers 1003, the first hard mask layer 303, and/or the second hard mask material of isolation regions 803. The CESL 1101 may be deposited using one or more low temperature deposition processes such as chemical vapor deposition, physical vapor deposition, or atomic layer deposition. According to an embodiment, the CESL 1101 may be formed as a multi-layered etch stop layer by depositing a first etch stop material (e.g., $AlO_2$) over the planar surfaces of the third metal layer used for the source/drain metal risers 1003, the first hard mask layer 303 and the second hard mask material of isolation regions 803 and by depositing a second etch stop material (e.g., SiN) over the first etch stop layer. The CESL 1101 may be deposited to an overall thickness of between about 10 Å and about 150 Å, such as about 70 Å, in accordance with some embodiments. However, any suitable etch stop materials, any suitable number of etch stop layers, and any suitable combinations thereof may be deposited to form the CESL 1101.

Once the CESL 1101 has been formed, the second ILD layer 1103 is deposited over the CESL 1101. The second ILD layer 1103 may be formed of a dielectric material such as oxides (e.g., silicon oxide (SiO2)) formed by any acceptable process (e.g., CVD, PEALD, thermal ALD, PECVD, or the like). However, other suitable insulation materials (e.g., PSG, BSG, BPSG, USG, or the like) deposited by any suitable method (e.g., CVD, PECVD, flowable CVD, or the like) may also be used. After formation, the second ILD layer 1103 may be cured, such as by an ultraviolet curing process, and then planarized using, e.g., a planarization process such as a chemical mechanical polishing process; although, any suitable process may be utilized. As such, the second ILD layer 1103 may be formed to a fourth thickness $Th_4$ of between about 5 nm and about 20 nm, such as about 13 nm. However, any suitable thickness may be utilized.

Once the second ILD layer 1103 has been formed and planarized, contact via openings for the gate via contact 1105 and the source/drain via contact 1107 are formed through the second ILD layer 1103 using one or more etching processes to form the openings. According to some embodiments, openings for the gate via contact 1105 are formed through the second ILD layer 1103, the CESL 1101, and the first hard mask layer 303 and openings for the source/drain via contact 1107 are formed through the second ILD layer 1103 and the CESL 1101. The openings may be formed using any combination of acceptable photolithography and suitable etching techniques such as dry etching process (e.g., plasma etch, reactive ion etch (RIE), physical etching (e.g., ion beam etch (IBE))), wet etching, combinations thereof, and the like. However, any suitable etching processes may be utilized to form the contact via openings.

Once formed, the openings may be filled or overfilled with one or more conductive materials to form the gate via contact 1105 and the source/drain via contact 1107. According to embodiments, a liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 1103. The remaining liner and conductive material forms the gate via contact 1105 and the source/drain via contact 1107 in the openings. According to embodiments, the gate via contact 1105 is physically coupled to the first metal layer 301 and is electrically coupled via the first metal layer 301 to the first gate stack 603A of the gate stacks 603. The source/drain via contact 1107 is physically coupled to the third source/drain metal riser 1003C and is electrically coupled via the third source/drain contact stack 1001C to the third source/drain region 201C. Furthermore, the gate via contact 1105 and the source/drain via contact 1107 may be formed in different processes or may be formed in the same process.

According to some embodiments, the gate via contact 1105 may be formed to an overall first height $H_1$ of between about 5 nm and about 45 nm, such as about 30 nm and may be formed with angled sidewalls that form a first angle $\theta 1$ with the first metal layer 301 of between about 80° and about 150°, such as about 97°. The gate via contact 1105 may be formed with a top width $W_3$ of between about 10 nm and about 20 nm, such as about 12 nm and with a base width $W_4$ of between about 8 nm and about 20 nm, such as about 10 nm. However, any suitable heights, any suitable angles, and any suitable widths may be used for the gate via contacts 1105.

According to some embodiments, the gate via contact 1105 in the cross-section of cutline 3-3' illustrated in FIG. 11 is formed with angled sidewalls between isolation regions 803 of corresponding source/drain regions 201 (e.g., 201A, 201B). Furthermore, according to some embodiments, the height of the isolation regions 803 (e.g., first thickness $Th_1$ of 803 of FIG. 8) may be directly correlated with the height of the corresponding source/drain metal risers 1003. As such, a gate via to source/drain contact (VG-MD) processing window is extended by the step height of the first source/drain metal riser 1003A associated with the isolation region 803 (e.g., $Th_1$ of 803 in FIG. 8) and by the first and second VG-MD processing window distances.

For example, and with respect to the first source/drain contact 503A, when the isolation region 803 is not present, the first source/drain contact 503A will extend to the CESL 1101 and, as such, will be separated from the gate via contact 1105 by a third distance $D_3$, which may be between about 1 nm and about 10 nm, such as about 5 nm. However, by recessing the first source/drain contact 503A and forming the isolation region 803, the first source/drain contact 503A may be separated from the gate via contact 1105 by a fourth distance $D_4$ of between about 1 nm and about 10 nm, such as about 6 nm. By extending the distance between the first source/drain contact 503A and the gate via contact 1105, the overall process window can be improved.

Furthermore, the source/drain via contacts 1107 may be formed, according to some embodiments, to an overall second height $H_2$ of between about 10 nm and about 30 nm, such as about 20 nm and may be formed with angled sidewalls that form a second angle $\theta_2$ with the third metal layer used for the source/drain metal risers 1003 of between about 80° and about 150°, such as about 107°. The source/drain via contact 1107 may be formed with a top width $W_5$ of between about 8 nm and about 20 nm, such as about 14 nm and with a base width $W_6$ of between about 8 nm and about 20 nm, such as about 12 nm. However, any suitable heights, any suitable angles, and any suitable widths may be used for the source/drain via contacts 1107.

Figure 12:
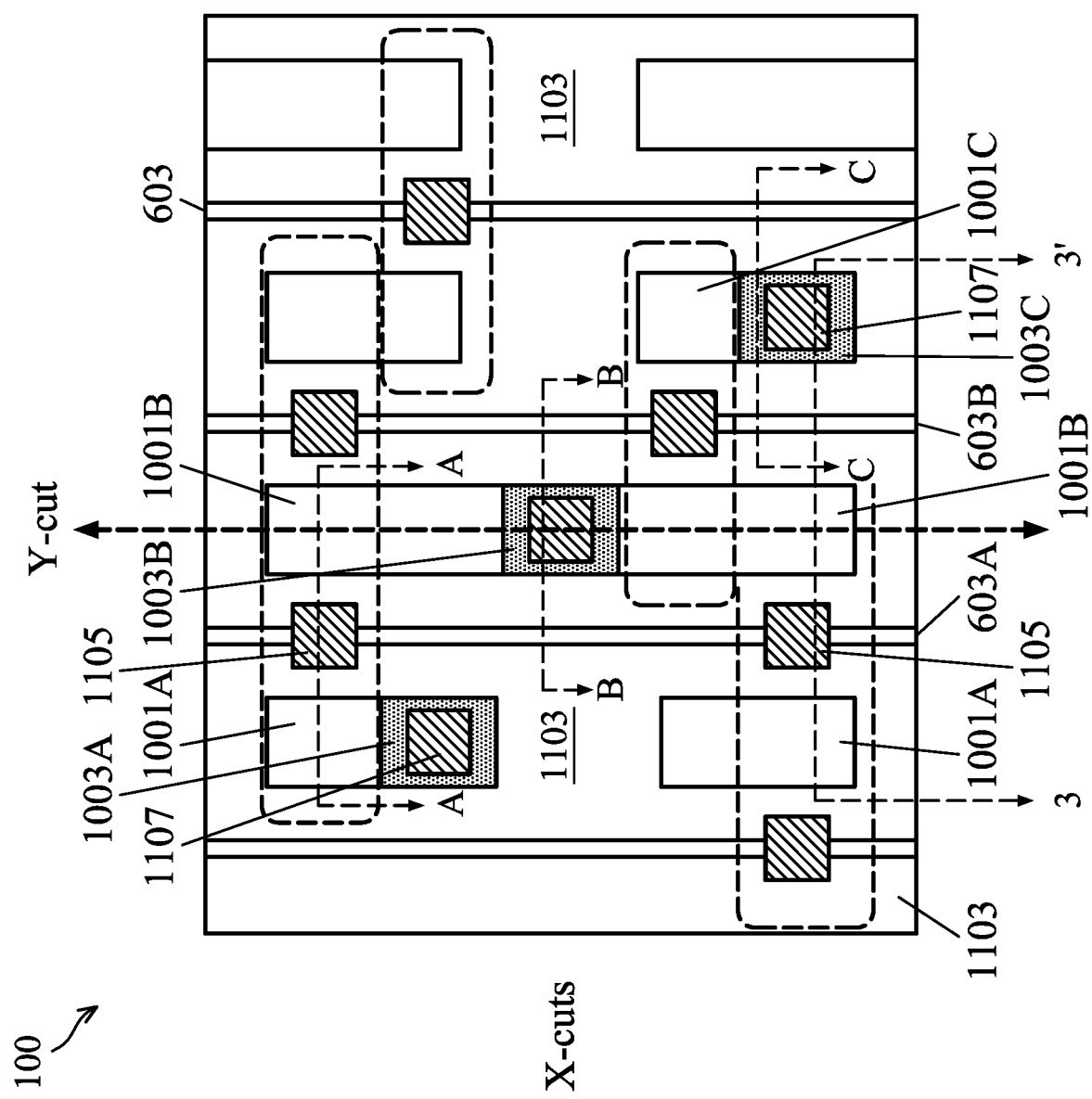

FIG. 12 illustrates a top-down view of the semiconductor device 100, according to some embodiments, with several cut-lines, including the cut-line 3-3' associated with the cross-sectional views of FIGS. 1 and 11, that are referenced below with regard to the following figures. The top-down view of FIG. 12 further illustrates a plurality of gate via contacts 1105 and a plurality of source/drain via contacts 1107 that are exposed through the planar surface of the second ILD layer 1103 of the semiconductor device 100. For clarity and for further reference with regard to the following figures, the underlying features of the hybrid source/drain contact stacks 1001, the source/drain metal risers 1003, and the gate stacks 603 and their relative positions are also illustrated in the top-down view of FIG. 12.

In particular, the cutline 3-3' illustrated in FIG. 12 intersects (e.g., going from left to right) the first source/drain contact stack 1001A, the gate via contact 1105, the first gate stack 603A, the second source/drain contact stack 1001B, the second gate stack 603B, the third source/drain contact stack 1001C, the third source/drain metal riser 1003C, and the source/drain via contact 1107. These features are also illustrated in FIG. 11 (e.g., going from left to right). The X-cuts (A-A, B-B, and C-C) and the Y-cut intersect various features of the semiconductor device 100 and are described in detail below with reference to the following figures.

Turning to FIG. 13A, this figure illustrates a plurality of cross-sectional views of the X-cuts of cut lines A-A, B-B, and C-C of FIG. 12, according to some embodiments. In the cross sectional view of cutline A-A of the X-cuts, there is illustrated the gate via contact 1105 formed through the second ILD layer 1103 and the CESL 1101 and is physically and electrically coupled via the first metal layer 301 to the gate stack 603 formed over the fin 107. The gate stack 603 and spacers 113 separate a portion of a first source/drain contact stack 1001A from a portion of a second source/drain contact stack 1001B. The portion of the first source/drain contact stack 1001A, as illustrated in the view of cutline A-A, is disposed between the fin 107 (and its associated source/drain region 201) and the isolation region 803 and the portion of the second source/drain contact stack 1001B, as illustrated in the view of cutline A-A, is disposed between the fin 107 (and its associated source/drain region 201) and the isolation region 803.

In the cross sectional view of cutline B-B of the X-cuts, there is illustrated the source/drain via contact 1107 formed through the second ILD layer 1103 and the CESL 1101 and is physically and electrically coupled via the first source/drain contact stack 1001A to the source/drain regions 201 formed in the fin 107. The first source/drain contact stack 1001A comprises the first source/drain metal riser 1003A, the first source/drain contact 503A, and (if present) the optional silicide contact 501. The first source/drain contact stack 1001A separates a first portion of the first hard mask layer 303 and a gate stack 603 from a second portion of the first hard mask layer 303 and another gate stack 603. The spacers 113 isolate the gate stacks 603 from the first source/drain contact stack 1001A. The gate stacks 603 and overlying first metal layer used for the source/drain metal risers 1003, as illustrated in the view of cutline B-B, are disposed between the fin 107 and the first portion of the first hard mask layer 303. The gate stack 603 and overlying first metal layer used for the source/drain metal risers 1003, as illustrated in the view of cutline B-B, are disposed between the fin 107 and the second portion of the first hard mask layer 303 disposed below the CESL 1101 and the second ILD layer 1103.

In the cross sectional view of the cutline C-C of the X-cuts, there is illustrated the second source/drain contact stack 1001B disposed below the CESL 1101 and the second ILD layer 1103. The second source/drain contact stack 1001B comprises the second source/drain metal riser 1003B, the second source/drain contact 503B, and (if present) a second section of the optional silicide contact 501. The second source/drain contact stack 1001B separates a first portion of the first hard mask layer 303 and a gate stack 603 from a second portion of the first hard mask layer 303 and another gate stack 603. The spacers 113 isolate the first gate stack 603A and the second gate stack 603B from the second source/drain contact stack 1001B. The gate stack 603 and overlying first metal layer used for the source/drain metal risers 1003, as illustrated in the view of cutline C-C, are disposed between the fin 107 and the first portion of the first hard mask layer 303 disposed below the CESL 1101 and the second ILD layer 1103. The gate stack 603 and overlying first metal layer used for the source/drain metal risers 1003, as illustrated in the view of cutline C-C, are disposed between the fin 107 and the second portion of the first hard mask layer 303 disposed below the CESL 1101 and the second ILD layer 1103. As such, in the cross-sectional view of cutline C-C, the second source/drain contact stack 1001B and the gate stacks 603 are physically and electrically isolated from the planar surface of the second ILD layer 1103 by the dielectric materials of the second ILD layer 1103.

Turning to FIG. 13B, this figure illustrates the cross-sectional view of the Y-cut of FIG. 12 and correlates with some features of the X-cut through cutline B-B, according to some embodiments. In the cross sectional view of the Y-cut, there is illustrated the source/drain via contact 1107 formed through the second ILD layer 1103 and the CESL 1101 and physically and electrically coupled via the hybrid source/drain contact stack 1001 to the source/drain regions 201 formed in the fin 107. The hybrid source/drain contact stack 1001 comprises the source/drain metal riser 1003, the source/drain contact 503, and (if present) the optional silicide contact 501. The isolation regions 803 isolate portions of the source/drain contact 503 from the CESL 1101. According to some embodiments, the source/drain contact 503 may have an overall width that is a sixth width $W_6$ of between about 10 nm and about 300 nm, such as about 25 nm and an overall height that is a third height $H_3$ of between about 5 nm and about 40 nm, such as about 20 nm.

FIG. 13B further illustrates some dimensions of some interfaces between the source/drain via contact 1107, the source/drain metal riser 1003, and the source/drain contact 503. According to some embodiments, at an interface between the source/drain via contact 1107 and the source/drain metal riser 1003, the source/drain via contact 1107 may have a seventh width $W_7$ of between about 8 nm and about 20 nm, such as about 12 nm. According to some embodiments, at an interface between the source/drain metal riser 1003 and the CESL 1101, the source/drain metal riser 1003 may have an eighth width $W_8$ of between about 10 nm and about 300 nm, such as about 15 nm and, at an interface between the source/drain metal riser 1003 and the source/drain contact 503, the source/drain metal riser 1003 may have a ninth width $W_9$ of between about 10 nm and about 300 nm, such as about 17 nm. As such, the source/drain metal riser 1003 allows for a greater surface area contact at the interface with the source/drain contact 503 as compared to the surface area contact that would be provided by the source/drain contact 503 alone.

According to some embodiments, the material of the source/drain via contact 1107 may be formed from the same material (e.g., tungsten (W)) as the source/drain metal riser 1003 to provide a low resistance interface between the source/drain via contact 1107 and the source/drain metal riser 1003. As such, the source/drain metal riser 1003 provides for lower Rc-power loss between the source/drain via contact 1107 and the source/drain contact 503. As discussed above, the isolation regions 803 allow for an enlarged processing window between the source/drain contact 503 and the gate via contact 1105. Therefore, the hybrid source/drain contact stack 1001 provides increased performance and yield with the isolation regions 803 allowing for an enlarged processing window and the source/drain metal riser 1003 providing a large surface area contact and a low resistance conductive interface with the source/drain contact 503.

Figure 14:
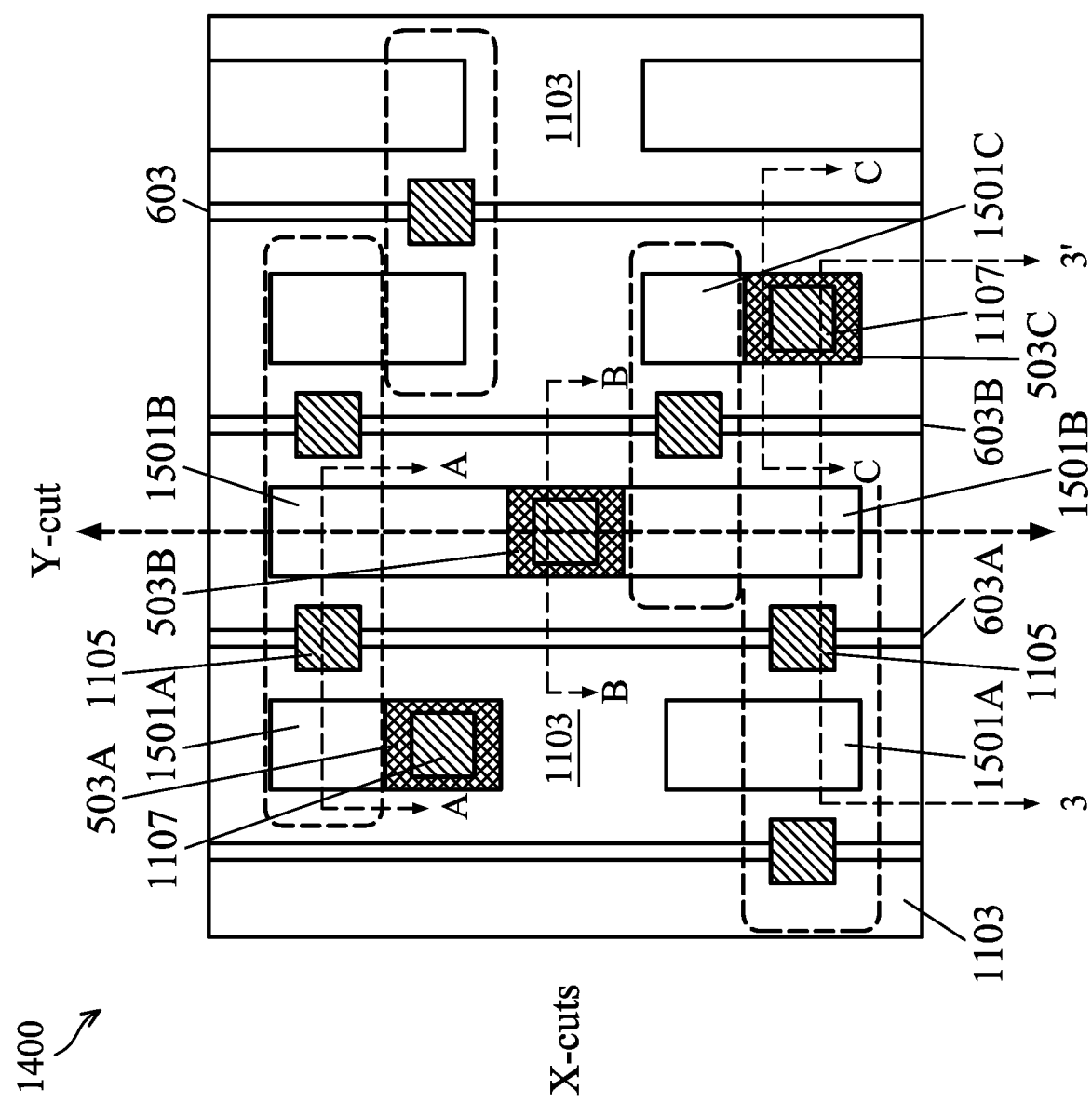

FIG. 14 illustrates, according to another embodiment, a top-down view of a semiconductor device 1400 comprising a plurality of contoured source/drain contact stacks (e.g., 1501A, 1501B, and 1501C). FIG. 14 includes features of the gate via contacts 1105 and the source/drain via contacts 1107 that are exposed through the planar surface of the second ILD layer 1103 of the semiconductor device 1400. For clarity and for further reference with regard to the following figures, FIG. 14 illustrates the underlying features of the contoured source/drain contact stack 1501, raised metal sections of the first source/drain contacts 503A (discussed in greater detail below), and the gate stacks 603 and their relative positions. FIG. 12 will now be referenced for comparison with FIG. 14 to discuss the features of the semiconductor device 1400. Furthermore, the X-cuts (cut lines A-A, B-B, and C-C) and the Y-cut referenced in FIG. 12 are also referenced in FIG. 14 for ease of comparison and are discussed in greater detail below with regard to the following figures. The item numbers used in FIG. 14 and in the following figures that have the same item numbers as those used in the discussion of the semiconductor device 100 above relate to the same or to similar features as those discussed in FIGS. 1-12; therefore, the discussions relating to the same or to similar features as those discussed in FIGS. 1-12 are not repeated below.

Figures 15A, 15B:
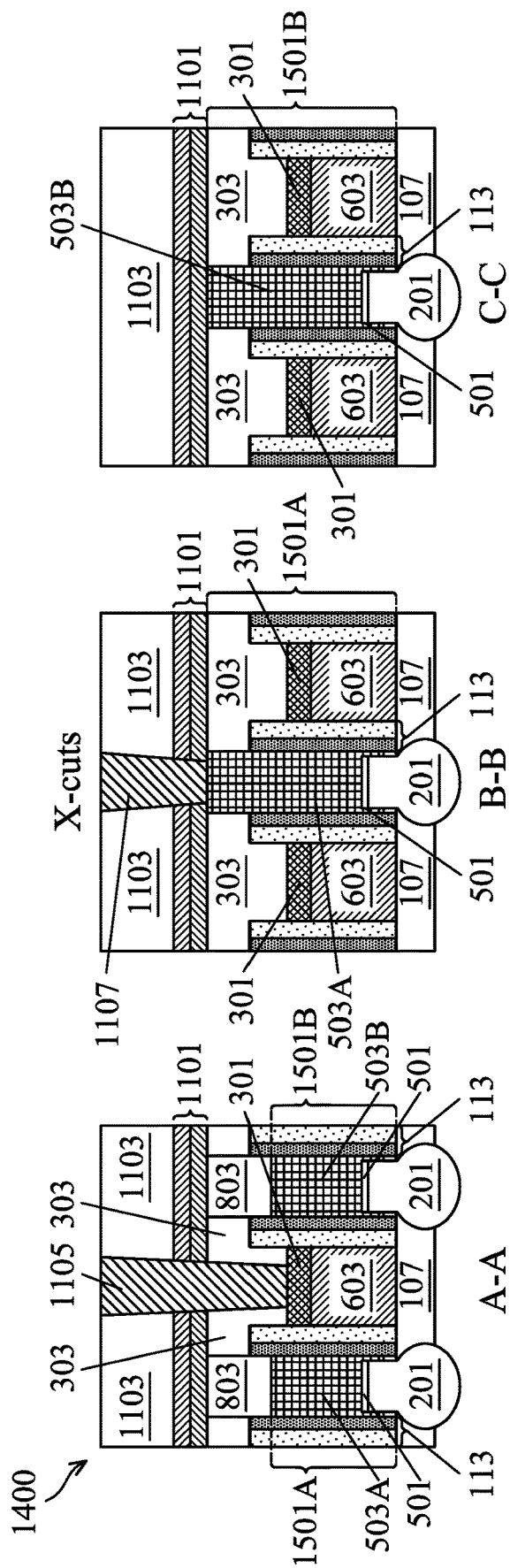

FIGS. 15A and 15B illustrate the cross-sectional views of the X-cuts (e.g., cut lines A-A, B-B, C-C) and the Y-cut of FIG. 14. By comparison, the source/drain metal risers 1003 (e.g., 1003A, 1003B, and 1003C) of FIG. 12 are not formed but are replaced by raised metal sections of the source/drain contacts 503 (e.g., 503A, 503B and 503C). According to some embodiments, the source/drain contacts 503 may be formed with the raised metal sections by depositing the CESL 1101 and second ILD layer 1103 over the structure illustrated in FIG. 8 without forming the second recesses 903 in the remaining one or more source/drain contacts 503 of the second metal layer as illustrated in FIG. 9 and without forming the source/drain metal risers 1003 (e.g., 1003A, 1003B, and 1003C) in the second recesses 903 as illustrated in FIG. 10. As such, the source/drain via contacts 1107 may be formed through the second ILD layer 1103 and through the CESL 1101, as described above with regard to FIG. 11, and may be formed over and in physical contact with the source/drain contacts 503 without having the source/drain metal risers 1003 formed there in-between.

In the cross sectional view of cutline A-A of the X-cuts in FIG. 15A, there is illustrated the gate via contact 1105, gate stack 603, and spacers 113 that separate a first contoured source/drain contact stack 1501A (e.g., of cutline B-B) from a second contoured source/drain contact stack 1501B (e.g., of cutline C-C). The first contoured source/drain contact stack 1501A, as illustrated in the view of cutline A-A, is disposed between the fin 107 (and its associated source/drain region 201) and the isolation region 803 and the second contoured source/drain contact stack 1501B, as illustrated in the view of cutline A-A, is disposed between the fin 107 (and its associated source/drain region 201) and the isolation region 803. In the cross sectional view of cutline B-B of the X-cuts of FIG. 15A, there is illustrated the source/drain via contact 1107 formed through the second ILD layer 1103 and the CESL 1101 and is physically and electrically coupled via the first contoured source/drain contact stack 1501A to the source/drain region 201 formed in the fin 107. The first contoured source/drain contact stack 1501A comprises the first source/drain contact 503A having a raised metal section and (if present) comprises the first section of the optional silicide contact 501. The first contoured source/drain contact stack 1501A separates the first and second portions of the first hard mask layer 303 and separates the gate stacks 603 and the spacers 113 isolate the gate stacks 603 from the first contoured source/drain contact stack 1501A.

In the cross sectional view of the cutline C-C of the X-cuts of FIG. 15A, there is illustrated the second contoured source/drain contact stack 1501B disposed below the CESL 1101 and the second ILD layer 1103. The second contoured source/drain contact stack 1501B comprises the second source/drain contact 503B with a raised metal section, and (if present) comprises the second section of the optional silicide contact 501. The second contoured source/drain contact stack 1501B separates the first and second portions of the first hard mask layer 303 from one another and separates the gate stacks 603 from one another and the spacers 113 isolate the gate stacks 603 from the second contoured source/drain contact stack 1501B.

Turning to FIG. 15B, this figure illustrates the cross-sectional view of the Y-cut of FIG. 14 and correlates with some features of the X-cut through cutline B-B of FIG. 14, according to some embodiments. In the cross sectional view of the Y-cut, there is illustrated the source/drain via contact 1107 formed through the second ILD layer 1103 and the CESL 1101 and is physically and electrically coupled via the contoured source/drain contact stack 1501 to the source/drain regions 201 formed in the fin 107. The contoured source/drain contact stack 1501 comprises the source/drain contact 503 with the raised metal section and (if present) comprises the optional silicide contact 501. FIG. 15B further illustrates that the source/drain via contact 1107 is formed in physical contact with and electrically coupled to the raised metal section of the source/drain contact 503 without an intervening source/drain metal riser 1003. As such, the surface area contact at the interface with the contoured source/drain contact stack 1501 is provided by contact surface of the source/drain via contact 1107 alone.

FIG. 15B further illustrates that the isolation regions 803 isolate portions of the source/drain contact 503 from the CESL 1101 and illustrates the raised metal section of the source/drain contact 503 interfaces with the CESL 1101 and sidewalls of the isolation regions 803. According to some embodiments, the raised metal section of the source/drain contact 503 of the contoured source/drain contact stack 1501 may have similar dimensions described above with regard to the source/drain metal riser 1003 of the hybrid source/drain contact stack 1001 and the remaining portions of the source/drain contact 503 of the contoured source/drain contact stack 1501 may have the same or similar dimensions described above with regard to the source/drain contact 503 of the hybrid source/drain contact stack 1001 illustrated in FIG. 13B. However, other suitable dimensions may also be utilized. As such, the contoured source/drain contact stack 1501 provides for a compact profile for the source/drain contact 503 and provides increased yield with the isolation regions 803 allowing for an enlarged processing window between the source/drain contact 503 and the gate via contact 1105.

According to some embodiments, the material of the source/drain via contact 1107 may be formed from the same material (e.g., tungsten (W)) as the source/drain contact 503 to provide a low resistance interface between the source/drain via contact 1107 and the source/drain contact 503. As such, the Rc power loss may be reduced between the source/drain via contact 1107 and the source/drain contact 503 of the same materials as compared to the Rc power loss due to the materials of the source/drain via contact 1107 and the source/drain contact 503 being different. As discussed above, the isolation regions 803 allow for an enlarged processing window between the source/drain contact 503 and the gate via contact 1105. Therefore, the contoured source/drain contact stack 1501 provides increased performance and yield with the isolation regions 803 allowing for an enlarged processing window between the source/drain contact 503 and the gate via contact 1105 and with the source/drain via contact 1107 providing a low resistance conductive interface with the source/drain contact 503.

FIGS. 16A and 16B illustrate, according to some other embodiments, a semiconductor device 1600 comprising the hybrid source/drain contact stack 1001 without the isolation regions 803 illustrated in figures above. The cross-sectional views of the X-cuts (e.g., cut lines A-A, B-B, C-C) and the Y-cut in FIGS. 16A and 16B will be described with reference to the top-down view in FIG. 12 and the X-cuts and Y-cut of FIGS. 13A and 13B. By comparison, the isolation regions 803 of FIGS. 13A and 13B are obviated in the X-cuts and Y-cut of FIGS. 16A and 16B. Furthermore, the CESL 1101 conforms to the surfaces of the first hard mask layer 303, the source/drain metal riser 1003 of the hybrid source/drain contact stack 1001, and the source/drain contacts 503.

According to some embodiments, the CESL 1101 may be formed to conform to the above mentioned surfaces by depositing the CESL 1101 and the second ILD layer 1103 over the structure illustrated in FIG. 10 without having deposited the second hard mask material of the isolation regions 803 in the first recesses 703 (as illustrated in FIG. 7) used to form the isolation regions 803 as illustrated in FIGS. 10 and 11. By comparison to FIG. 11, rather than being formed on planar surfaces of the isolation regions 803, the CESL 1101 and the second ILD layer 1103 are formed within the first recesses 703 (illustrated in FIG. 8) and conform to the planar surfaces of the first hard mask layer 303 and conform to the sidewalls of the first hard mask layer 303 and to the recessed surfaces of the first source/drain contact 503A and the second source/drain contact 503B within the first recesses 703. As such, the enlarged processing window between the 503A and the 1105, as described above with regard to FIG. 11, is maintained by the conforming layers of the CESL 1101 and the second ILD layer 1103, without the presence of the isolation regions 803.

In the cross sectional view of cutline A-A of the X-cuts in FIG. 16A, there is illustrated the gate via contact 1105, gate stack 603, and spacers 113 that separate the first source/drain contact stack 1001A (e.g., of cutline B-B) from a second source/drain contact stack 1001B (e.g., of cutline C-C). The first source/drain contact stack 1001A, as illustrated in the view of cutline A-A, is disposed between the fin 107 and the CESL 1101 and the second source/drain contact stack 1001B, as illustrated in the view of cutline A-A, is disposed between the fin 107 and the CESL 1101. In the cross sectional view of cutline B-B of the X-cuts of FIG. 16A, there is illustrated the source/drain via contact 1107 formed through the second ILD layer 1103 and the CESL 1101 and is physically and electrically coupled via the first source/drain contact stack 1001A to the source/drain region 201 formed in the fin 107. The first source/drain contact stack 1001A comprises the first source/drain metal riser 1003A, the first source/drain contact 503A and (if present) the first section of the optional silicide contact 501. The first source/drain contact stack 1001A separates portions of the first hard mask layer 303 and separates the gate stacks 603. The spacers 113 isolate the gate stacks 603 from the first source/drain contact stack 1001A.

In the cross sectional view of the cutline C-C of the X-cuts of FIG. 16A, there is illustrated the second source/drain contact stack 1001B disposed below the CESL 1101 and the second ILD layer 1103. The second source/drain contact stack 1001B comprises the second source/drain metal riser 1003B, the second source/drain contact 503B, and (if present) the second section of the optional silicide contact 501. The second source/drain contact stack 1001B separates the first and second portions of the first hard mask layers 303 from one another and separates the gate stacks 603 from one another and the spacers 113 isolate the gate stacks 603 from the second source/drain contact stack 1001B.

Turning to FIG. 16B, this figure illustrates the cross-sectional view of the a semiconductor device 1600 comprising the hybrid source/drain contact stack 1001 without the isolation regions 803 illustrated in figures above, according to some embodiments. In the cross sectional view of the Y-cut, there is illustrated the source/drain via contact 1107 formed through the second ILD layer 1103 and the CESL 1101 and is physically and electrically coupled via the hybrid source/drain contact stack 1001 to the source/drain regions 201 formed in the fin 107. The hybrid source/drain contact stack 1001 comprises the source/drain metal riser 1003, the source/drain contact 503 and (if present) the optional silicide contact 501. The source/drain metal riser 1003 of FIG. 16B may be formed with the same or similar dimensions as the source/drain metal riser 1003 of FIG. 13B and may be formed with the same material (e.g., tungsten (W)) as the source/drain via contact 1107 to provide a contact interface with reduced Rc power loss. However any suitable dimensions and any suitable materials may be used. As such, the source/drain metal riser 1003 illustrated in FIG. 16B provides provide a low resistance conductive interface with greater surface area contact with the source/drain contact 503, as described above. Furthermore, the enlarged processing window between the source/drain contact 503 and the gate via contact 1105 is maintained by the conformal layers of the CESL 1101 and the second ILD layer 1103, even without the presence of the isolation regions 803. As such, the hybrid source/drain contact stack 1001 of FIG. 16B provides increased performance and yield by allowing for an enlarged processing window.

Embodiments disclosed herein are directed towards finFET devices with reduced resistance/capacitance of an interface between a source/drain via and a source/drain contact and with an enhanced processing window between a gate via and a source/drain contact. In some embodiments, a metal riser is formed over a source/drain contact providing a wide surface contact area as compared to a surface area at an interface between a source/drain contact via and the metal riser. According to some embodiments, the source/drain contact via and the metal riser are formed from a same material. As such, finFET devices are provided with reduced resistance/capacitance power loss at the interfaces between the metal riser and one or more of the source/drain contact via and the source/drain contact. In some embodiments, a recess formed in a portion of a source/drain contact of a finFET device extends a processing window disposed between the recess and a gate contact of the finFET. In some embodiments, the recess over the source/drain contact is filled with an isolation material and in some embodiments, a conformal layer of a contact etch stop layer of the finFET is formed over the source/drain contact and along sidewalls of the recess. As such, finFET devices are provided with an enhanced processing window between a gate via and a source/drain contact.

In accordance with an embodiment, a method includes: recessing a first portion of a source/drain contact to form a recess disposed within a first dielectric layer of a finFET device, the source/drain contact being formed from a first metal material; depositing a second metal material to form a metal riser in the recess and in physical contact with the source/drain contact, the second metal material being different from the first metal material and an interface between the metal riser and the source/drain contact having a first width being smaller than a width of the source/drain contact; depositing a second dielectric layer over the metal riser; etching an opening through the second dielectric layer and exposing the metal riser through the second dielectric layer; and depositing a third metal material in the opening through the second dielectric layer and in physical contact with the metal riser to form a source/drain contact via, an interface between the source/drain contact via and the metal riser having a second width that is smaller than the first width. In an embodiment, the method further includes before depositing the second dielectric layer, recessing a second portion of the source/drain contact of the finFET device. In an embodiment, the method further includes depositing an etch stop layer in a recess of the second portion of the source/drain contact and in physical contact with the source/drain contact. In an embodiment depositing the etch stop layer comprises forming a sidewall of the etch stop layer as an interface with a sidewall of the metal riser. In an embodiment the method further comprises depositing a conformal layer of a contact etch stop layer over and in physical contact with the metal riser and the source/drain contact. In an embodiment the depositing the second metal material to form the metal riser comprises using a conductive fill material and wherein depositing the third metal material to form the source/drain contact via comprises using the conductive fill material. In an embodiment, the using the conductive fill material comprises using a tungsten fill material.

In another embodiment, a method includes: forming a first source/drain region and a second source/drain region in a fin of a semiconductor device; depositing a first dielectric layer over the fin; forming a gate stack after the depositing the first dielectric layer; depositing a hard mask layer over the gate stack; forming a first source/drain contact to the first source/drain region and forming a second source/drain contact to the second source/drain region; recessing a portion of the first source/drain contact and forming a first recess; filling the first recess with a first dielectric material, the first dielectric material being different from a material composition of the hard mask layer; forming a gate contact via to the gate stack, the first dielectric material being spaced apart from the gate contact via a first distance and wherein a surface of the first source/drain contact located along a top of the recess is spaced apart from the gate contact via a second distance greater than the first distance, the first distance being parallel with the second distance; and forming a source/drain contact via over and electrically coupled to the second source/drain contact in a portion of the second source/drain contact over the fin, wherein a material of the source/drain contact via is different from a material of the second source/drain contact. In an embodiment the method further includes planarizing the first dielectric material with the hard mask layer. In an embodiment the filling the first recess with the first dielectric material further comprises: conformal depositing a contact etch stop layer over a planar surface of the hard mask layer, over sidewalls of the first recess and over an exposed portion of the first source/drain contact, the contact etch stop layer deposited on the sidewalls of the first recess forming an interface with the hard mask layer opposite the sidewall of the gate contact via; and depositing a second dielectric layer over the contact etch stop layer. In an embodiment the method further includes: before forming the source/drain contact via, etching a portion of the second source/drain contact to form a second recess; and forming a metal riser over and in physical contact with the second source/drain contact. In an embodiment a first width at an interface between the metal riser and the second source/drain contact is less than a width of the source/drain contact. In an embodiment a second width of an interface between the source/drain contact via and the metal riser is less than the first width. In an embodiment the source/drain contact via comprises tungsten. In an embodiment the second source/drain contact comprises cobalt.

In accordance with yet another embodiment, a semiconductor device includes: a source/drain contact disposed over and electrically coupled to a source/drain region of a fin of a semiconductor substrate, the source/drain contact comprising a first metal; a metal riser disposed over and in physical contact with the source/drain contact, the metal riser comprising a second metal being different from the first metal; and a source/drain via disposed over and in physical contact with the metal riser, the source/drain via comprising the second metal, wherein an interface between the metal riser and the source/drain contact is larger than an interface between the source/drain via and the metal riser. In an embodiment the semiconductor device further includes an etch stop layer disposed over the source/drain contact, wherein a sidewall of the etch stop layer interfaces a sidewall of the metal riser. In an embodiment the second metal comprises tungsten. In an embodiment the first metal comprises cobalt. In an embodiment the semiconductor device further includes: an isolation region comprising a first dielectric material disposed over the source/drain contact, wherein a sidewall of the isolation region interfaces a sidewall of the metal riser; a gate stack disposed over a channel region of the fin; and a gate via disposed over and electrically coupled to the gate stack; and a hard mask layer comprising a second dielectric material and separating the gate via from the isolation region and from the metal riser, the second dielectric material being different from the first dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    recessing a first portion of a source/drain contact to form a recess disposed within a first dielectric layer of a finFET device, the source/drain contact being formed from a first metal material;
    depositing a second metal material to form a metal riser in the recess and in physical contact with the source/drain contact, the second metal material being different from the first metal material and an interface between the metal riser and the source/drain contact having a first width being smaller than a width of the source/drain contact;
    depositing a second dielectric layer over the metal riser;
    etching an opening through the second dielectric layer and exposing the metal riser through the second dielectric layer;

depositing a third metal material in the opening through the second dielectric layer and in physical contact with the metal riser to form a source/drain contact via, an interface between the source/drain contact via and the metal riser having a second width that is smaller than the first width;

before depositing the second dielectric layer, recessing a second portion of the source/drain contact of the finFET device; and depositing an etch stop layer in a recess of the second portion of the source/drain contact and in physical contact with the source/drain contact.

2. The method of claim 1, wherein the depositing the etch stop layer comprises forming a sidewall of the etch stop layer as an interface with a sidewall of the metal riser.

3. The method of claim 1, further comprising depositing a conformal layer of a contact etch stop layer over and in physical contact with the metal riser and the source/drain contact.

4. The method of claim 1, wherein the depositing the second metal material to form the metal riser comprises using a conductive fill material and wherein depositing the third metal material to form the source/drain contact via comprises using the conductive fill material.

5. The method of claim 4, wherein the using the conductive fill material comprises using a tungsten fill material.

6. A method, comprising:

forming a first source/drain region and a second source/drain region in a fin of a semiconductor device;

depositing a first dielectric layer over the fin;

forming a gate stack after the depositing the first dielectric layer;

depositing a hard mask layer over the gate stack;

forming a first source/drain contact to the first source/drain region and forming a second source/drain contact to the second source/drain region;

recessing a portion of the first source/drain contact and forming a first recess;

filling the first recess with a first dielectric material, the first dielectric material being different from a material composition of the hard mask layer;

forming a gate contact via to the gate stack, the first dielectric material being spaced apart from the gate contact via a first distance and wherein a surface of the first source/drain contact located along a top of the first recess is spaced apart from the gate contact via a second distance greater than the first distance, the first distance being parallel with the second distance; and forming a source/drain contact via over and electrically coupled to the second source/drain contact in a portion of the second source/drain contact over the fin, wherein a material of the source/drain contact via is different from a material of the second source/drain contact.

7. The method of claim 6, further comprising planarizing the first dielectric material with the hard mask layer.

8. The method of claim 6, wherein the filling the first recess with the first dielectric material further comprises:

conformal depositing a contact etch stop layer over a planar surface of the hard mask layer, over sidewalls of the first recess and over an exposed portion of the first source/drain contact, the contact etch stop layer deposited on the sidewalls of the first recess forming an interface with the hard mask layer opposite the sidewall of the gate contact via; and depositing a second dielectric layer over the contact etch stop layer.

9. The method of claim 6, further comprising:

before forming the source/drain contact via, etching a portion of the second source/drain contact to form a second recess; and forming a metal riser over and in physical contact with the second source/drain contact.

10. The method of claim 9, wherein a first width at an interface between the metal riser and the second source/drain contact is less than a width of the source/drain contact.

11. The method of claim 10, wherein a second width of an interface between the source/drain contact via and the metal riser is less than the first width.

12. The method of claim 11, wherein the source/drain contact via comprises tungsten.

13. The method of claim 12, wherein the second source/drain contact comprises cobalt.

14. A method of manufacturing a semiconductor device, the method comprising:

forming a source/drain contact disposed over and electrically coupled to a source/drain region of a fin of a semiconductor substrate, the source/drain contact comprising a first metal;

forming a metal riser disposed over and in physical contact with the source/drain contact, the metal riser comprising a second metal being different from the first metal;

forming a source/drain via disposed over and in physical contact with the metal riser, the source/drain via comprising the second metal, wherein an interface between the metal riser and the source/drain contact is larger than an interface between the source/drain via and the metal riser;

forming an isolation region comprising a first dielectric material disposed over the source/drain contact, wherein a sidewall of the isolation region interfaces a sidewall of the metal riser;

forming a gate stack disposed over a channel region of the fin;

forming a gate via disposed over and electrically coupled to the gate stack; and forming a hard mask layer comprising a second dielectric material and separating the gate via from the isolation region and from the metal riser, the second dielectric material being different from the first dielectric material.

15. The method of claim 14, further comprising forming an etch stop layer disposed over the source/drain contact, wherein a sidewall of the etch stop layer interfaces a sidewall of the metal riser.

16. The method of claim 14, wherein the second metal comprises tungsten.

17. The method of claim 16, wherein the first metal comprises cobalt.

18. The method of claim 1, wherein the metal riser comprises aluminum.

19. The method of claim 18, wherein the third metal material comprises copper.

20. The method of claim 1, wherein the first width is between about 10 nm and about 17 nm.

* * * * *